United States Patent
Fastow et al.

(10) Patent No.: US 8,520,437 B2
(45) Date of Patent: *Aug. 27, 2013

(54) HIGH READ SPEED MEMORY WITH GATE ISOLATION

(75) Inventors: Richard Fastow, Cupertino, CA (US); Hagop Nazarian, San Jose, CA (US); Lei Xue, Milpitas, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/600,527

(22) Filed: Aug. 31, 2012

(65) Prior Publication Data

US 2012/0327717 A1    Dec. 27, 2012

Related U.S. Application Data

(63) Continuation of application No. 12/824,352, filed on Jun. 28, 2010, now Pat. No. 8,279,674.

(51) Int. Cl.
*G11C 11/34* (2006.01)
*G11C 16/04* (2006.01)
*G11C 5/06* (2006.01)

(52) U.S. Cl.
USPC .............. 365/185.17; 365/185.05; 365/63

(58) Field of Classification Search
USPC ................. 365/185.05, 185.17, 63
See application file for complete search history.

(56) References Cited

U.S. PATENT DOCUMENTS

| 6,510,082 B1 * | 1/2003 | Le et al. ............... 365/185.16 |
| 6,525,969 B1 * | 2/2003 | Kurihara et al. ......... 365/185.25 |
| 6,650,566 B2 | 11/2003 | Jeong et al. |
| 6,853,029 B2 | 2/2005 | Ichige et al. |
| 7,122,432 B2 | 10/2006 | Shimizu et al. |
| 7,142,455 B1 | 11/2006 | Lee et al. |
| 7,217,964 B1 | 5/2007 | Fastow et al. |
| 7,288,809 B1 | 10/2007 | Fastow et al. |
| 7,388,783 B2 | 6/2008 | Sakui |
| 7,397,696 B1 | 7/2008 | Wadhwa et al. |
| 7,450,422 B2 | 11/2008 | Roohparvar |
| 7,535,767 B2 | 5/2009 | Nazarian et al. |
| 7,567,457 B2 | 7/2009 | Nazarian et al. |
| 7,633,786 B2 | 12/2009 | Goda et al. |
| 7,652,947 B2 | 1/2010 | Bernstein et al. |
| 8,279,674 B2 * | 10/2012 | Fastow et al. ............ 365/185.17 |
| 2003/0141538 A1 | 7/2003 | Hayashi |
| 2008/0225594 A1 | 9/2008 | Lee et al. |

OTHER PUBLICATIONS

Lehmann, "Memory Circuit with Multi-Bit-Line Direct Sensing", Feb. 25, 2004, Siemens AG/IP.com, IPCOM000021650D, pp. 1-5.
Office Action dated May 23, 2011 for U.S. Appl. No. 12/642,162, 26 pages.

* cited by examiner

*Primary Examiner* — Ly D Pham
(74) *Attorney, Agent, or Firm* — Turocy & Watson, LLP

(57) ABSTRACT

Providing for a serial array memory transistor architecture that achieves high read speeds compared with conventional serial array memory is described herein. By way of example, the serial array memory can be connected to and can drive a gate voltage of a small capacitance pass transistor, to facilitate sensing memory transistors of the serial array. The pass transistor modulates current flow or voltage at an adjacent metal bitline, which can be utilized to sense a program or erase state(s) of the memory transistors. Due to the small capacitance of the pass transistor, read latency for the serial array can be significantly lower than conventional serial array memory (e.g., NAND memory). Further, various mechanisms for forming an amplifier region of the serial array memory comprising discrete pass transistor are described to facilitate efficient fabrication of the serial array memory transistor architecture.

20 Claims, 13 Drawing Sheets

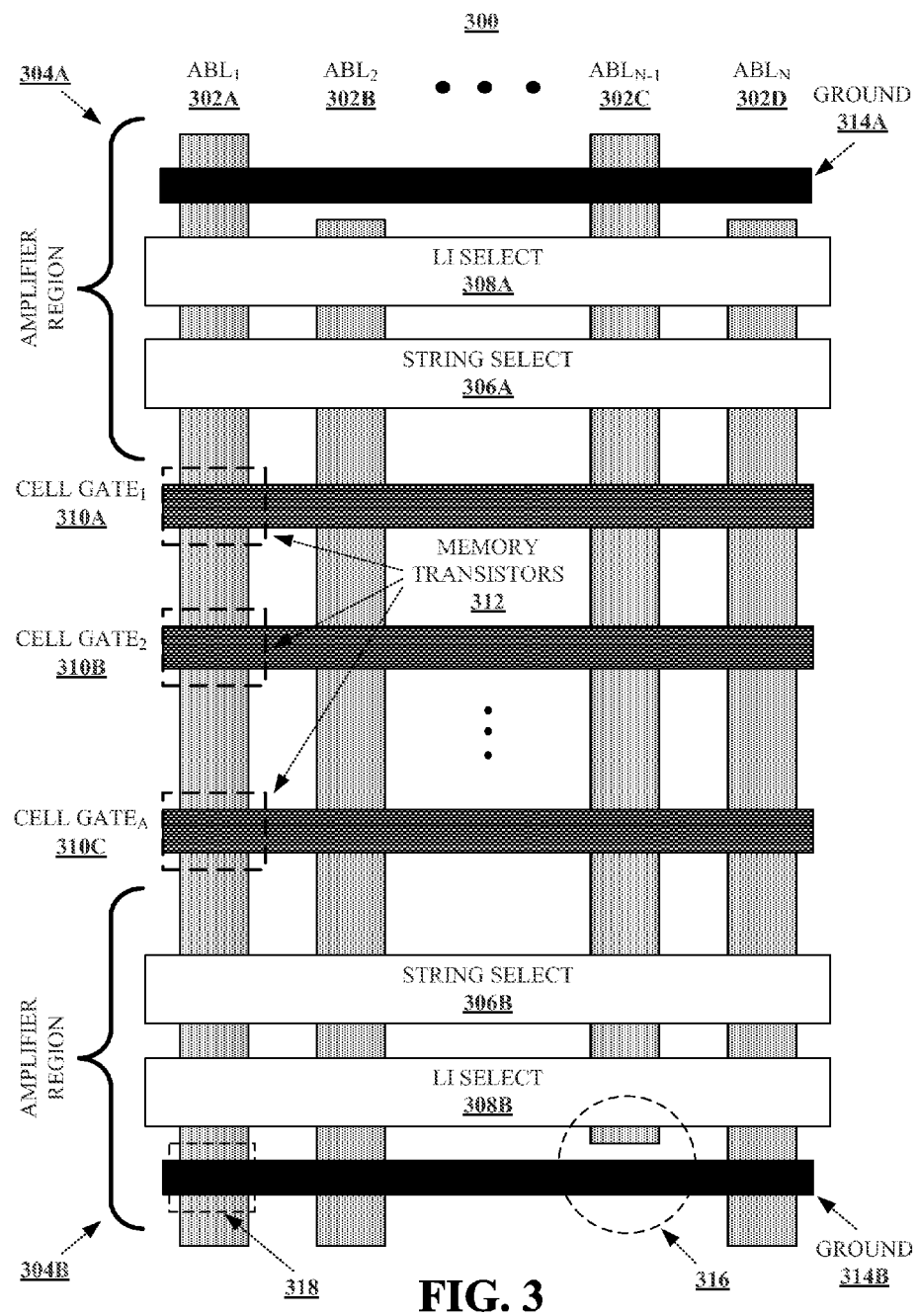

HIGH READ SPEED MEMORY WITH GATE ISOLATION

CROSS-REFERENCE TO RELATED APPLICATIONS

This application is a Continuation of application Ser. No. 12/824,352 filed Jun. 28, 2010, the entire contents of which is hereby incorporated by reference.

REFERENCE TO CO-PENDING APPLICATION FOR PATENT

The present Application for Patent is related to co-pending U.S. patent application Ser. No. 12/642,162 entitled "HIGH READ SPEED ELECTRONIC MEMORY WITH SERIAL ARRAY TRANSISTORS" and filed Dec. 18, 2009, assigned to the assignee hereof, and expressly incorporated by reference herein.

BACKGROUND

Memory devices have a wide range of uses in modern electronics and electronic devices. In general, various types of electronic memory exist, including hard disc memory, floppy disc memory, magnetic tape memory, optical disk memory, and so on. One of the more innovative and diversified types of memory is semiconductor memory.

One type of semiconductor memory commonly used for modern electronics is nonvolatile Flash memory. Flash memory comprises arrays of semiconductor memory transistors that can be utilized to store, erase and re-store digital information. Compared to other types of electronic memory, Flash memory is fast both in terms of programming and erasing, as well as reading data, has good data retention characteristics, and is highly cost effective. Accordingly, Flash memory is utilized for data storage in an ever-increasing number of electronic devices and applications, including computers, cell phones, smart-phones, digital cameras and camcorders, game stations, and so forth.

Early forms of semiconductor memory required continuous access to electrical power to enable data retention. For instance, volatile semiconductor memory requires an external voltage to be applied on one region of a memory transistor to maintain a stored charge in another region of the memory transistor. If the external voltage drops below a required level, the stored charge is lost. For a volatile memory device, such as random access memory (RAM), the lost charge results in lost data. Although volatile semiconductor memory has significant advantages, including high program and read speeds, the threat of data loss has made volatile semiconductor memory suitable primarily for RAM applications, especially given non-volatile mass storage alternatives such as hard drives, disc drives, and so on.

One great advantage of Flash memory is that stored data can be retained without continuous electrical power applied to a Flash memory module. In addition, Flash memory is a solid-state technology that can be very dense—in terms of memory cells per unit volume—typically requiring no moving parts for basic operation. Accordingly, Flash memory is ideal as removable and portable data storage for consumer electronics, and is utilized with universal interface technologies for a wide array of electronic devices, such as universal serial bus (USB) technology. The non-volatile nature of Flash memory suggests employing Flash for RAM applications. However, RAM is typically faster and more compact than Flash, and consumes relatively low power. Thus, additional improvements in Flash density and speed would be required to employ Flash memory as a RAM replacement in many devices and applications.

One area where Flash has made successful inroads is in hard disc replacement. Hard discs are non-volatile and have very high storage capacity, but often have slower read and write times than Flash memory devices and have moving mechanical parts that are much less shock resistant than semiconductor-based memory. Accordingly, computer and electronic devices can achieve performance and reliability improvements when utilizing a non-volatile semiconductor hard drive, such as a Flash hard drive.

SUMMARY

The following presents a simplified summary of the subject disclosure in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

In various aspects of the subject disclosure, provided is a non-volatile semiconductor memory architecture achieving improved performance or reliability relative conventional semiconductor memory. According to one aspect, the subject disclosure provides a serial array memory transistor architecture that drives a discrete gate of a small capacitance pass transistor to facilitate accessing memory transistors of the serial array. The discrete transistor gate modulates current flow or voltage at an adjacent metal bitline, which can be utilized to sense a program or erase state(s) of the memory transistors. Due to the small capacitance of the pass transistor, read latency for the serial array can be significantly lower than conventional serial array memory (e.g., NAND memory).

In a particular aspect, the serial array memory transistor architecture employs NAND or NAND-type memory transistors. Conventional NAND memory transistors typically achieve high program and erase speeds, but suffer from high read latency due to read processes that discharge high capacitance metal bitlines through a high resistance NAND string. By employing NAND transistors for the disclosed serial array memory transistor architecture in conjunction with a pass transistor having a discrete transistor gate, significant improvement in read latency is achieved.

According to a further aspect of the subject disclosure, a masking operation is employed for forming the small capacitance pass transistor. This masking operation can mitigate complexities involved in forming discrete and isolated transistor gates in a semiconductor formation process. Selective masking can also be utilized to mitigate complexity in interconnecting a diffusion layer of the serial arrays of memory transistors and the gate of the small capacitance transistor. Further, selective masking can be employed to isolate the diffusion layer, near the interconnect with the gate of the small capacitance transistor, from ground.

According to one or more other aspects of the subject disclosure, a method of forming a semiconductor memory device is described. The method can comprise forming active bitlines in a semiconductor substrate, and forming a series of transistor gates transverse to the active bitlines to create arrays of serially connected memory transistors. In one aspect, an etching procedure or a masking procedure can be employed to break or shorten an end of one or more active bitlines, to electrically isolate those ends from other components of the semiconductor memory device, such as ground. Further, the method can comprise employing a photoresist mask for masking discrete portions of subsets of the active bitlines in an amplifier region of the semiconductor memory device, to block conductive doping of the masked discrete portions of the active bitlines. Additionally, the method can comprise forming discrete pass transistors at least partially over the undoped or lightly doped portions of the active bitlines, and coupling respective pass transistor gates to respective serial arrays of memory transistors. In an alternative aspect, the method can comprise employing masking to first form gates of the discrete pass transistors, removing the masking of the amplifier region, and then doping remaining portions of the amplifier region.

The following description and the annexed drawings set forth in detail certain illustrative aspects of the disclosed subject matter. These aspects are indicative, however, of but a few of the various ways in which the principles of the innovation can be employed and the disclosed subject matter is intended to include all such aspects and their equivalents. Other advantages and novel features of the disclosed subject matter will become apparent from the following detailed description of the innovation when considered in conjunction with the drawings.

BRIEF DESCRIPTION OF THE DRAWINGS

FIG. 3 depicts a block diagram of a semiconductor layout for serial array semiconductor memory according to further aspects.

DETAILED DESCRIPTION

Figure 1:
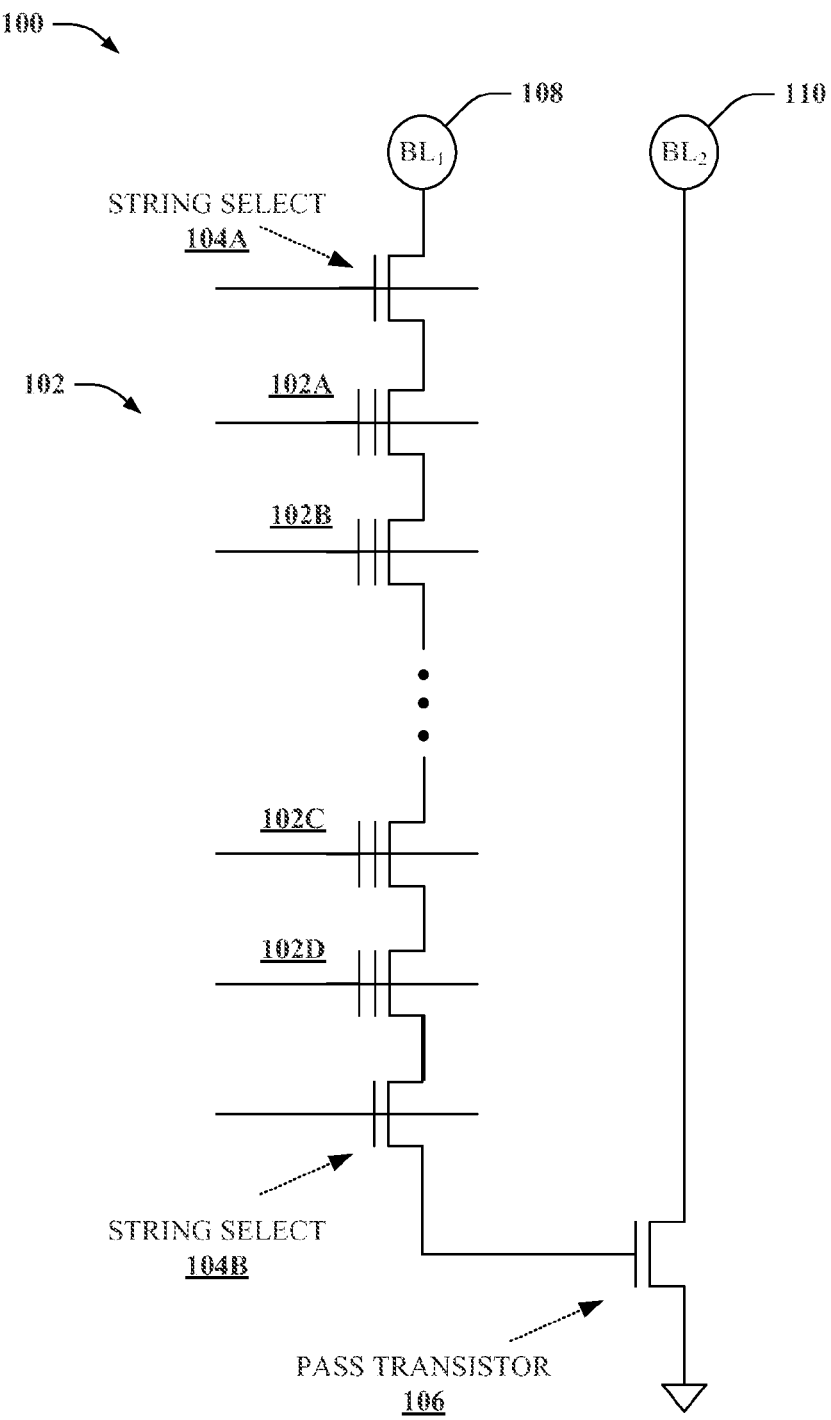
FIG. 1 depicts a diagram of an example serial array semiconductor memory architecture according to aspects of the subject disclosure.

The disclosed subject matter is described with reference to the drawings, wherein like reference numerals are used to refer to like elements throughout the description. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram or schematic form in order to facilitate describing the subject innovation.

As utilized herein, terms "component," "system," "architecture" and the like are intended to refer to a computer or electronic-related entity, either hardware, a combination of hardware and software, software (e.g., in execution), or firmware. For example, a component can be one or more semiconductor storage cells, a processor, a process running on the processor, an object, an executable, a program, or a computer. The component can include erasable programming (e.g., process instructions at least in part stored in erasable memory) or hard programming (e.g., process instructions burned into non-erasable memory at manufacture). By way of illustration, both a process executed from memory and the processor can be a component. One or more components can reside within a process or thread of execution and a component can be localized on one processing device (e.g., onboard processing) or distributed between two or more processing devices (e.g., involving onboard and host computer processing). As another example, an architecture can include an arrangement of electronic hardware (e.g., parallel or serial transistors), processing instructions and a processor, which implement the processing instructions in a manner suitable to the arrangement of electronic hardware.

Furthermore, the claimed subject matter can be implemented as a method, apparatus, or article of manufacture using typical manufacturing, programming or engineering techniques to produce hardware, firmware, software, or any combination thereof to control an electronic device to implement the disclosed subject matter. The term "article of manufacture" as used herein is intended to encompass an electronic device, a semiconductor device, a computer, or a computer program accessible from any computer-readable device, carrier, or media. Computer-readable media can include hardware media, or software media. In addition, the media can include storage media, or transport media. For example, computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, signal interface modules (e.g., a wireless communication interface), or the like. Of course, those skilled in the art will recognize many modifications can be made to this configuration without departing from the scope or spirit of the claimed subject matter.

The disclosed subject matter relates to improved non-volatile memory and performance thereof. More specifically, provided is a new non-volatile memory architecture that achieves significant benefits over conventional non-volatile memory architectures including optimal program/erase times as well as optimal read times. Also disclosed are methods for forming the non-volatile memory architecture in a multi-layer semiconductor. Discrete pass transistor gates can be formed into the multi-layer semiconductor and connected to one end of a serial array of memory transistors (e.g., at an active bitline region). These pass transistor gates can in turn modulate current or voltage of a metal bitline adjacent to the serial array, enabling the serial array to be sensed from the adjacent metal bitline. In one aspect, forming the discrete transistor gates can comprise employing a self-aligned poly process or a dedicated patterning process. In an alternative aspect, a substrate region beneath the adjacent metal bitline is masked during active bitline doping to accommodate the channel region of the discrete pass transistor gate. As yet another alternative, masking of the substrate region beneath the adjacent metal bitline can be employed to first form the discrete pass transistor gate, which then serves as a mask for subsequent doping of the remainder of the substrate region to form the channel regions. The masking can streamline semiconductor fabrication, enabling non-discrete transistor formation and active bitline doping via continuous processing techniques, and simplifying formation of the discrete pass transistor gates.

FIG. 1 illustrates a schematic diagram of an example serial array semiconductor memory architecture 100 according to aspects of the subject disclosure. Memory architecture 100 comprises an array 102 of memory transistors 102A, 102B, 102C, 102D (collectively 102A-102D) arranged electrically in serial along respective channel regions thereof (referred to herein as a serial array) of the respective memory transistors 102A-102D. The ends of serial array 102 are connected to respective string select transistors 104A, 104B (which define respective amplifier regions of memory architecture 100— not depicted) that can be utilized to activate or select serial array 102 among other memory transistor arrays (not depicted) of architecture 100. As a particular example, to select array 102 for program or read operations, an activation voltage can be applied to string select transistors 104A, 104B.

At one end, serial array 102 is connected via string select transistor 104B to a gate region of a pass transistor 106. Thus, voltage or current flow through serial array 102 can modulate or control a gate voltage of pass transistor 106. At an opposite end, serial array 102 is connected via string select transistor 104A with a first metal bitline 108 of the memory architecture. A contact can be employed to electrically connect metal bitline 108 to a diffusion layer associated with serial array 102 (e.g., see FIGS. 4A-4D and FIG. 6, infra). First metal bitline 108 can be utilized to apply voltage or current to serial array 102, to program or to read the program/erase state of memory transistors 102A-102D. As current flows through serial array 102, charge accumulates at a gate region of pass transistor 106, increasing gate voltage thereof As with many semiconductor transistors, this gate voltage can modulate current flow through an active region of pass transistor 106.

Further to the above, the active region of pass transistor 106 is connected to a second metal bitline 110 of memory architecture 100, and further to ground. Accordingly, the gate voltage of pass transistor 106 enables or disables the active region, which in turn modulates current flow at second metal bitline 110. By appropriate processing (e.g., control of voltage applied to first metal bitline 108, current induced at serial array 102, wordline selection of various memory transistors 102A-102D, and so forth), program/erase states of respective memory transistors 102A-102D can be correlated to the current flow at second metal bitline 110, or voltage of the second metal bitline 110. Accordingly, a sensing circuit (not depicted) can be connected to second metal bitline 110 to enable sensing of array 102 from the adjacent second metal bitline 110.

It should be appreciated that in at least some aspects of the subject disclosure, pass transistor 106 can be of relatively small capacitance, for instance with respect to capacitance of first metal bitline 108 and second metal bitline 110. Furthermore, pass transistor 106 can have relatively small resistance compared with a resistance of serial array 102. These features of pass transistor 106, as well as the arrangement depicted in memory architecture 100 can yield faster read times over conventional serial array semiconductor memory, as described below.

In a conventional serial array semiconductor memory (e.g., NAND Flash memory) an array of memory transistors is connected at one end to a metal bitline of the semiconductor memory, and at an opposite end to ground (e.g., in a case where string select transistor 104B is connected to ground instead of to pass transistor 106). To read a selected memory transistor of this conventional serial array, a read voltage can be applied to the selected memory transistor gate, while a higher pass voltage is applied to the other wordlines in the serial array. If the selected memory transistor has a threshold voltage lower than the read voltage, then the metal bitline can discharge through the serial array. If the selected memory transistor has a threshold voltage higher than the read voltage, however, then the metal bitline will not be able to discharge through the serial array. However, because the metal bitline has relatively high capacitance, and the serial array has high resistance, discharging the metal bitline through the conventional serial array can take a significant amount of time, slowing down the read operation. In contrast, the metal bitline need not discharge through serial array 102 for a program or erase state of one of memory transistors 102A-102D to be determined. Rather, serial array 102 drives a gate voltage of pass transistor 102, which modulates current or voltage at second metal bitline 110. This current or voltage at second metal bitline 110 is indicative of the program or erase state of memory transistors 102A-102D. Because capacitance and resistance of pass transistor 106 are small, a relatively small amount of charge from serial array 102 can drive the gate voltage, and can do so in a much shorter time than would be required to discharge array 102. Accordingly, current or voltage at second metal bitline 110 can be modulated quickly, enabling fast reading of memory transistors 102A-102D. Semiconductor memory architecture 100 therefore provides a significant advantage over conventional serial array memory, providing read speeds up to orders of magnitude faster than conventional NAND.

According to one or more particular aspects of the subject disclosure, pass transistor 106 can be formed having a discrete or isolated transistor gate region. The discrete gate region can be beneficial to mitigate current leakage from the pass transistor gate. Furthermore, the discrete gate region can potentially be formed within an amplifier region of a semiconductor memory architecture (100) without significantly increasing size of the amplifier region. This further can facilitate compact or cost effective semiconductor fabrication. For instance, by requiring minimal changes to existing serial array fabrication processes, existing mask designs, existing fabrication hardware, and so on.

Figure 2:
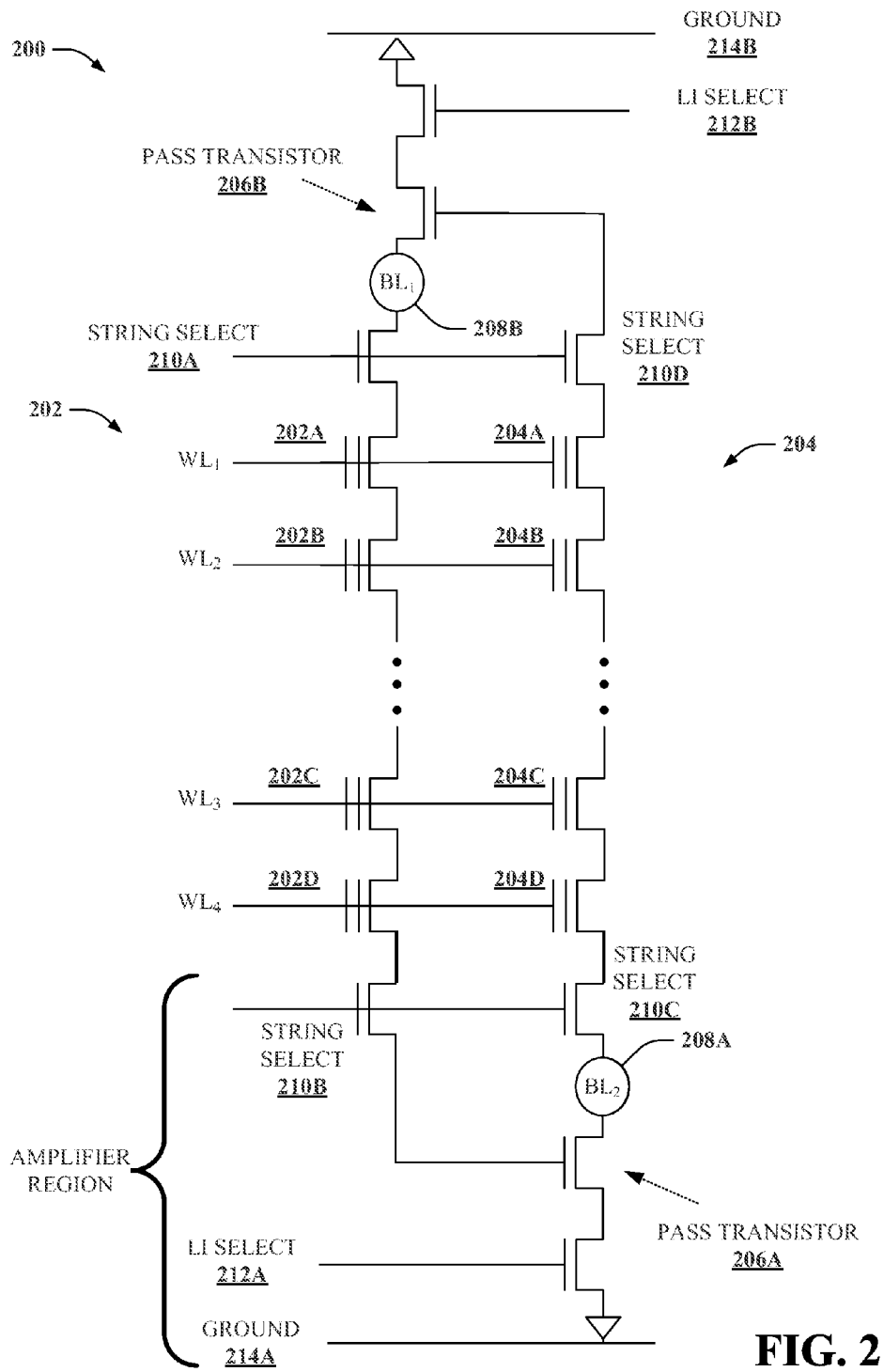
FIG. 2 illustrates a diagram of a sample high density serial array semiconductor memory architecture according to particular aspects.

FIG. 2 illustrates a schematic diagram of a sample serial array semiconductor memory architecture 200 according to further aspects of the subject disclosure. Architecture 200 can provide increased transistor density as compared with architecture 100, supra, for instance. As an example, architecture 200 can provide high read speed serial array memory transistors 202, 204 at each active bitline of a semiconductor memory device.

As depicted, architecture 200 comprises a first serial array 202 of memory transistors 202A, 202B, 202C, 202D (referred to collectively as 202A-202D) connected at either end by string select transistors 210A and 210B. Furthermore, string select transistor 210A electrically connects serial array 202 to a contact with a first metal bitline 208B of architecture 100 (e.g., see FIG. 6, infra). In addition, string select transistor 210B connects serial array 202 to a gate of a first pass transistor 206A. Further, a source or dragion region of pass transistor 206A connects a second metal bitline 208A to ground 214A through LI select transistor 212A (e.g., where the drain of the pass transistor is connected to a contact off of metal bitline 208A and the source of the pass transistor is connected to ground 214A through select transistor 212A). As such, a gate voltage of pass transistor 206A modulates current flow or voltage at metal bitline 208A. Since this gate voltage is controlled by voltage applied or induced at serial array 202, a correlation exists between current/voltage of serial array 202 and metal bitline 208A, e.g., where voltage is applied at wordlines $WL_1$, $WL_2$, $WL_3$, $WL_4$ (collectively referred to as $WL_1$-$WL_4$). Accordingly, a program or erase state of memory transistors 202A-202D can be sensed at metal bitline 208A.

Architecture 200 further comprises a second serial array 204 of memory transistors 204A, 204B, 204C, 204D (referred to collectively as 204A-204D) connected at either end by string select transistors 210C and 210D. Specifically, string select transistor 210C electrically connects a first end of serial array 204 to the contact off of metal bitline 208A, and string select transistor 210D electrically connects an opposite end of serial array 204 to a gate of a second pass transistor 206B. Further, a source or drain of pass transistor 206B connects metal bitline 208B to ground 214B though LI select transistor 212B. Therefore, in a similar manner as described above with respect to serial array 202, voltage induced or applied at serial array 204 (e.g., from metal bitline 208A or at wordlines $WL_1$-$WL_4$, respectively) controls a gate voltage of pass transistor 206B, which in turn modulates current flow or voltage at metal bitline 208B. Thus, a program or erase state of memory transistors 204A-204D can be sensed from metal bitline 208B, as program or erase states of memory transistors 202A-202D can be sensed from metal bitline 208A.

Figure 6:
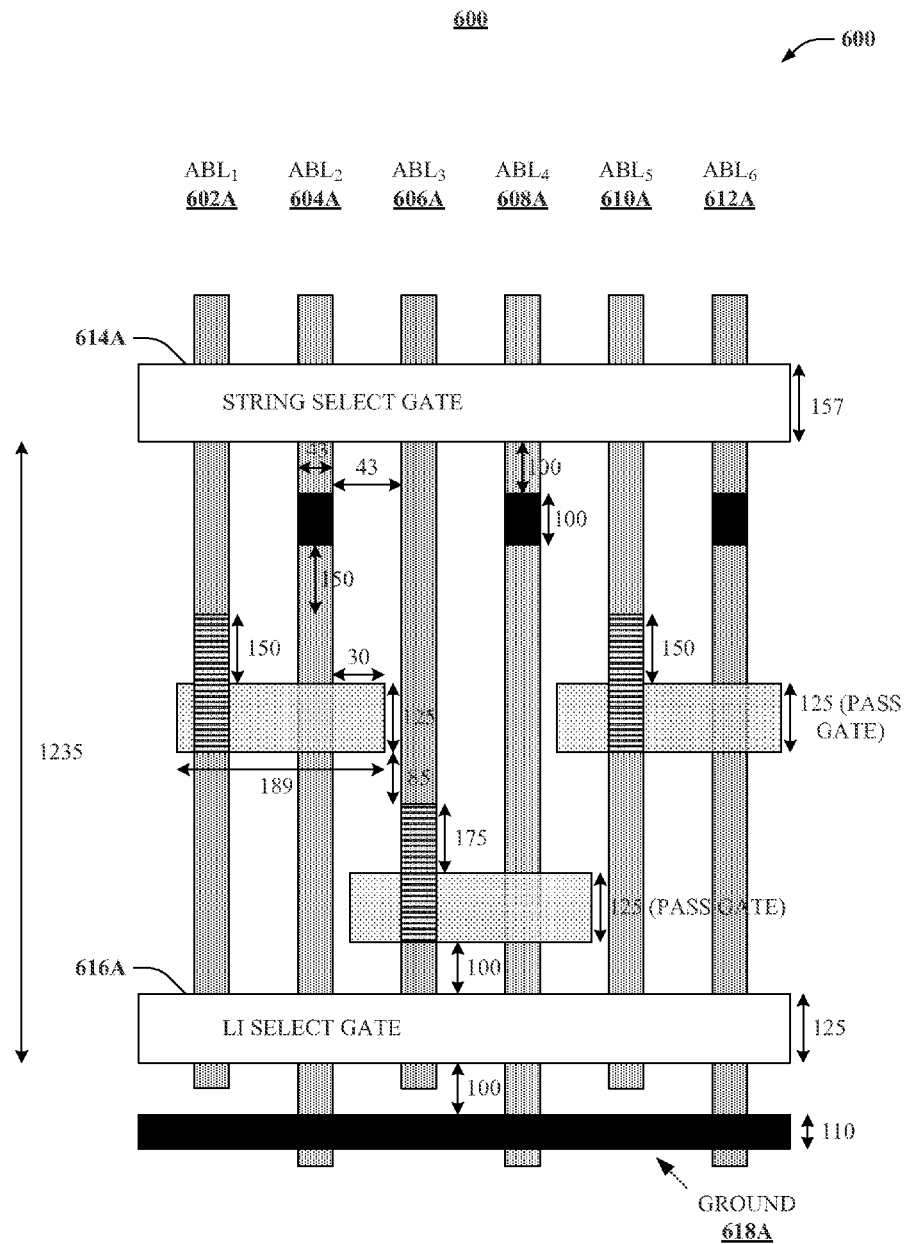
FIG. 6 illustrates a block diagram of an example amplifier region for a serial array semiconductor according to one or more aspects.

As depicted, architecture 200 enables fabrication of a serial array of memory transistors (202, 204) for each active bitline of a semiconductor memory device (e.g., see FIGS. 3 and 6, infra). This arrangement helps to maximize density of such a memory device, yielding higher numbers of memory transistors per unit area (or per unit volume for stacked arrays of memory transistors).

As is utilized herein, a region of a semiconductor that includes a string select transistor, bitline contact, pass transistor, and an LI select transistor, and optionally ground, is referred to as an amplifier region (or optionally a select region). The lower amplifier region comprising string select transistors 210B, 210C, bitline contact 208A, pass transistor 206A and LI select transistor 212A (and optionally ground 214A) is indicated in FIG. 2. It should also be appreciated, although not specifically depicted, that architecture 200 can also include an additional amplifier region comprising string select transistors 210A, 210D, bitline contact 208B, pass transistor 206B and LI select transistor 212B (and optionally ground 214B).

FIG. 3 illustrates a block diagram of an example semiconductor layout 300 according to further aspects of the subject disclosure. In at least one aspect, layout 300 can be a top-down view of a semiconductor memory device similar to semiconductor memory architecture 200 (although not all features of architecture 200 are necessarily shown in top-down layout 300, and vice versa). Further, it should be appreciated that layout 300 is but one example semiconductor layout suitable to implement one or more aspects of the subject disclosure; others semiconductor layouts, including additional or alternative semiconductor layers, layer arrangements, and so on, known to one of skill in the art or made known by way of the context provided herein are incorporated as part of the subject disclosure.

Semiconductor layout 300 comprises a plurality of active bitlines $ABL_1$ 302A, ABL2 302B, $ABL_{N-1}$ 302C, $ABL_N$ 302D, where N is an integer (referred to collectively as 302A-302D). Active bitlines 302A-302D can be formed into a first layer of a multi-layer semiconductor device (e.g., a silicon substrate layer) via a semiconductor trenching procedure. Further, active bitlines 302A-302D extend at least from one amplifier region 304A of semiconductor layout 300 to a second amplifier region 304B. The respective amplifier regions 304A, 304B enable selection of one or more arrays of memory cells of the semiconductor layout 300. As an example, amplifier regions 304A, 304B can enable selection of a block of memory cell arrays, as well as individual memory cell arrays of the block.

Amplifier region 304A comprises wordlines formed transverse to active bitlines 302A-302D, forming a string select gate region 306A and an LI select gate region 308A. String select gate region 306A is formed into a second layer of the multi-layer semiconductor device of semiconductor layout 300 transverse to active bitlines 302A-302D. At each intersection of string selection gate region 306A and an active bitline (302A-302D) is formed a string select transistor. The string select transistors can facilitate selection of individual arrays of memory transistors of semiconductor layout 300.

In addition to the foregoing, amplifier region 304A comprises the LI select gate region 308A formed into a layer of the multi-layer semiconductor device of semiconductor layout 300. This layer comprising LI select gate region 308A can be the second layer of the multi-layer semiconductor device, or another layer (e.g., a third layer, a fourth layer, and so forth). At each intersection of LI select gate region 308A and an active bitline, an LI select transistor is formed. Each LI select transistor is connected to a pass transistor (not depicted, but see for example FIG. 8, infra), and alternating LI select transistors are connected to ground 314A. Pass transistors connected to ground can serve to connect or isolate an active bitline from ground 314A (e.g., a LI select transistor at an intersection of LI select gate region 308A and active bitline 302A can be utilized to electrically connect active bitline 302A to ground 314A, or electrically isolate active bitline 302A from ground 314A).

It should be appreciated that each of active bit lines 302A-302D are connected to either ground 314A (via an LI select transistor formed at LI select gate 308A) or to ground 314B (via an LI select transistor formed at LI select gate 308B), but not both. Particularly, alternating active bit lines 302A, 302C, . . . are connected to ground 314A at LI Select gate 308A, and alternating active bit lines 302B, 302D, . . . , are connected to ground 314B at LI Select gate 308B, as depicted at FIG. 3. An opposite end of active bit lines 302A, 302C, . . . , is isolated from ground 314B at LI Select gate 308B, whereas an opposite end of active bit lines 302B, 302D, . . . , is isolated from ground 314A at LI Select gate 308A. This arrangement can facilitate some of the high read speed NAND operations described herein. Particularly, by coupling one end of an active bitline (e.g., $ABL_1$ 302B) to a discrete gate of a pass transistor—which has a channel region on a neighboring active bitline (e.g., $ABL_2$ 302B)—and an opposite end of the active bitline to a metal bitline contact and to ground, an array of memory transistors (e.g., memory transistors 312) can be charged at the metal bitline, and read from a contact with the neighboring bitline. If the pass transistor has low capacitance, its gate voltage can rapidly change in response to an increase or decrease in current flow on the active bitline, facilitating high speed read operations for memory transistors on the active bitline. Where alternating active bitline pairs are arranged as depicted in FIG. 3, according to the schematic of FIG. 2 supra, for instance, semiconductor density can be increased for the high read speed process described above.

Various techniques can be employed for isolating selected active bitlines from ground 314A or 314B. For example, active bitlines 302A-302D are formed into a substrate of a semiconductor wafer. Active bitline formation can comprise employing a trenching process to physically isolate adjacent bitlines, and filling trenched regions with an oxide to electrically isolate the adjacent bitlines. A gate layer is then formed over the active bitlines 302A-302D to deposit LI Select gates 308A and 308B, string select gates 306A and 306B, as well as cell gates 310A-310C. It should be appreciated that formation of all of the gate layers can be implemented as a single process operation, or can be implemented as multiple process steps, optionally with other steps (e.g., masking) performed in between (e.g., see FIG. 4, infra). After the gate layers are formed, ground 314A and 314B are formed, optionally in conjunction with applying metal bitline contacts and pass transistor interconnects. In addition, the active bitlines are doped e.g., cross-hatch regions of active bitline 802 of FIG. 8, infra) to form electrical contacts between transistors (e.g., memory transistors 312, string select transistors, LI Select transistors, etc.) formed into the active bitlines. In one aspect of the subject disclosure, the doping is performed prior to gate formation and in conjunction with a masking operation that mitigates or prevents deposition at active regions of the transistors. In another aspect, the doping is performed after gate formation. In this latter case, respective transistor gates can serve to shield the active regions from deposition.

In one aspect of the subject disclosure, a mask can be employed over a region of an active bitline that is to be isolated from ground, to prevent doping in that region. For instance, an upper end of active bitline$_2$ 302B, lower region of active bitline$_{N-1}$ 302C depicted by the dashed circle at 316, and upper region of active bitline$_N$ 302D (where the shaded regions of active bitlines 302B-302D end short of ground 314A, ground 314B and ground 314A respectively) can be masked during conductive doping of active bitlines 302B-302D to prevent electrical conductivity along these active bitlines with ground 314A or 314B. This in effect can terminate active bitlines 302B-302D as electrical conductors short of ground 314A or 314B, as depicted. Thus, in this aspect, active bitlines 302B-302D can physically extend as far as active bitline$_1$ 302A, for instance, but not as electrical conductors (e.g., compare the cross-hatched region of active bitline 802 of FIG. 8, infra, between ground 812A and LI Select gate$_1$ 804A, where active bitline 802 is electrically isolated from ground, and between ground 812B and LI Select gate$_2$ 804B, where active bitline 802 is electrically connected to ground).

In an alternative aspect of the subject disclosure, the shortened areas of active bitlines 302B-302D (e.g., region 316 of active bitline$_{N-1}$ 302C) can be physically formed by an etching or trenching process. In this aspect, a region of a silicon substrate used to form active bitlines 302B-302D can be physically removed at the shortened regions of those active bitlines. This can serve to physically isolate these active bitlines from ground 314A or ground 314B, to mitigate current flow to ground 314A or 314B. In at least one aspect, an oxide deposition or other insulating material can be filled onto the substrate at these regions to further electrically isolate active bitlines 302B-302D from ground.

In yet another aspect of the subject disclosure, a mask can be employed to electrically isolate an active bitline from ground. For instance, a lower region of active bitline$_1$ 302A comprises a mask 318 that can be employed for this purpose. In one instance, mask 318 can comprise a salicide block mask that serves as an electrical barrier to current flow between active bitline$_1$ 302A and ground 314B. In at least one aspect of the subject disclosure, a single process for isolating active bitlines 302A-302D from ground can be employed, whereas in other aspects a combination of the foregoing or of like techniques for isolating active bitlines 302A-302D from ground can be employed instead. In at least one aspect of the subject disclosure, electrically isolating one or more active bitlines from ground can be implemented by a suitable combination of preventing bitline doping, etching or digging, or an insulating mask, or a like electrical isolation technique.

Likewise, amplifier region 304B comprises additional wordlines formed transverse to active bitlines 302A-302D forming a string select gate region 306B and a LI select gate region 308B. Similar to amplifier region 304A, at each intersection of string select gate region 306B and an active bitline is a string select transistor. These string select transistors in amplifier region 304B, in addition to string select transistors in amplifier region 304A, can enable selection of a single array of memory transistors of semiconductor layout 300. Once selected, memory transistors of a single serial array can be programmed, erased, read, and so on. Amplifier region 304B also comprises LI select gate region 308B formed transverse to active bitlines 302A-302D, and adjacent to string select gate region 306B. Each intersection of LI select gate region 308D and an active bitline 302A-302D forms a LI select transistor in amplifier region 304B. These LI select transistors can connect respective active bitlines of semiconductor layout 300 to ground 314B, or isolate respective active bitlines from ground 314B.

Semiconductor layout 300 further comprises wordlines forming a series of memory transistor gate regions, including cell gate$_1$ 310A, cell gate$_2$ 310B, through cell gate$_A$ 310C, where A is a positive integer (referred to collectively as 310A-310C). At an intersection of each memory transistor gate region 310A-310C and an active bitline 302A-302D is a memory transistor 312. For instance, at an intersection of active bitline 302A and cell gate regions 310A-310C are memory transistors 312. Groups of memory transistors (e.g., memory transistors 312) formed along a single active bitline (e.g., active bitline 302A) by memory transistor gate regions 310A-310C form a serial array of memory transistors. Accordingly, intersection of a plurality of memory transistor gate regions 310A-310C with a plurality of active bitlines 302A-302D forms a set of serial arrays of memory transistors, electrically connected in serial along each active bitline 302A-302D.

In one alternative aspect, upon forming the transverse gate regions of semiconductor layout 300 (including, e.g., string select 306A, LI select 308A, string select 306B, LI select 308B, and cell gate regions 310A-310C), the multi-layer semiconductor device of semiconductor layout 300 is doped with conductive material. The doping can comprise, for instance, implanting suitable conductive material into active bitlines 302A-302D, such that the doped regions of the active bitlines are electrically conductive. Further, regions of active bitlines 302A-302D beneath the transverse gate regions (306A, 306B, 308A, 308B, and 310A-310C) are blocked from the doping, and are not implanted with conductive material. Accordingly, these regions of active bitlines 302A-302D beneath the transverse gate regions are semiconducting regions (as long as the semiconductor substrate layer is formed of a suitable semiconducting material), forming a channel region of the respective memory transistors 312. Further, because regions of the active bitlines 302A-302D between the transverse gate regions are doped as electrical conductors, each active bitline 302A-302D acts as an electrical conductor coupling the respective memory transistors 312, and respective arrays of memory transistors to string select transistors (not depicted) and LI select transistors (not depicted). Current flow through an active bitline 302A-302D can occur if and only if all transistors are conducting.

In another alternative aspect, selective masking of amplifier regions 304A and 304B can be established to form discrete portions of one or more wordlines (not depicted) in amplifier region 304A and 304B. These discrete portions of the one or more wordlines become gates of discrete pass transistors. Additionally, these discrete portions can serve as masks for conductive doping of the substrate layer of the remainder of amplifier regions 304A and 304B, to form channel regions of the respective discrete pass transistors (see, e.g., FIGS. 4A-4D and 5, infra). The pass transistors can then be employed for providing high read speed capability to semiconductor layout 300, and can be formed according to various processes and geometries, as is described in more detail herein. As one particular example, gates of the pass transistors can be formed with the same material as wordlines that form gates of the cell gate regions 310A-310C, LI select transistors (308A, 308B) and string select transistors (306A, 306B). Optionally, the gates of the pass transistors and the wordlines can be formed at the same time.

FIGS. 4A, 4B, 4C and 4D (referred to collectively as FIGS. 4A-4D) depict block diagrams of alternative example layouts 400A, 400B, 400C, 400D (referred to collectively as 400A-400D) for an amplifier region of a multi-layer semiconductor memory device. Particularly, amplifier region layouts 400A-400B provide different mechanisms for forming isolated pass transistors within the respective amplifier regions. The isolated pass transistors can be employed to improve read speeds of serial array memory transistors, and to facilitate reading memory transistors from adjacent metal bitline (e.g., a metal bitline that is adjacent to an active bitline into which a selected memory transistor is formed).

Figure 4A:
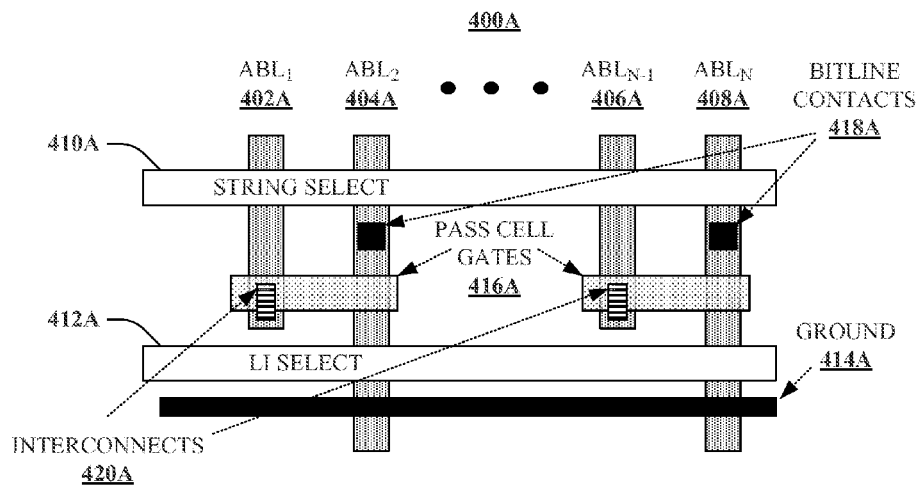
FIGS. 4A through 4D illustrate alternative amplifier regions for the serial array semiconductor memory architectures described herein.
Figure 4B:
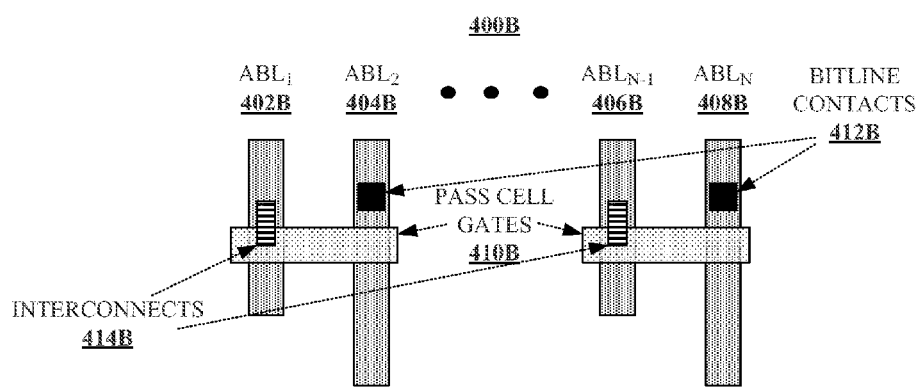
Figure 4C:
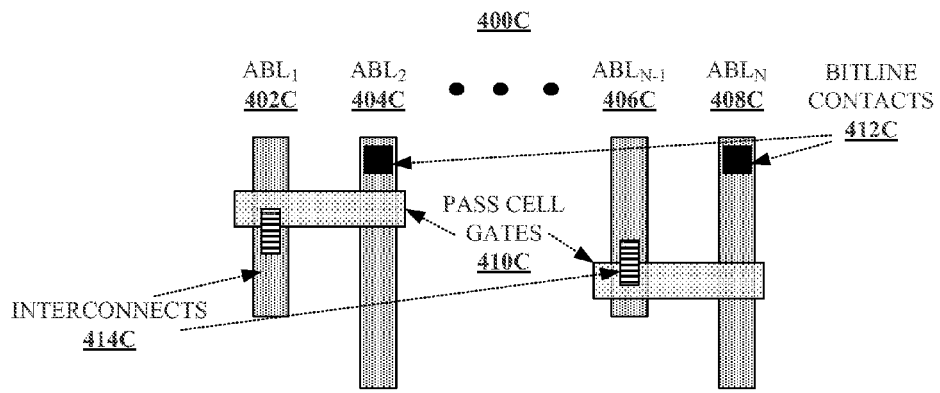
Figure 4D:
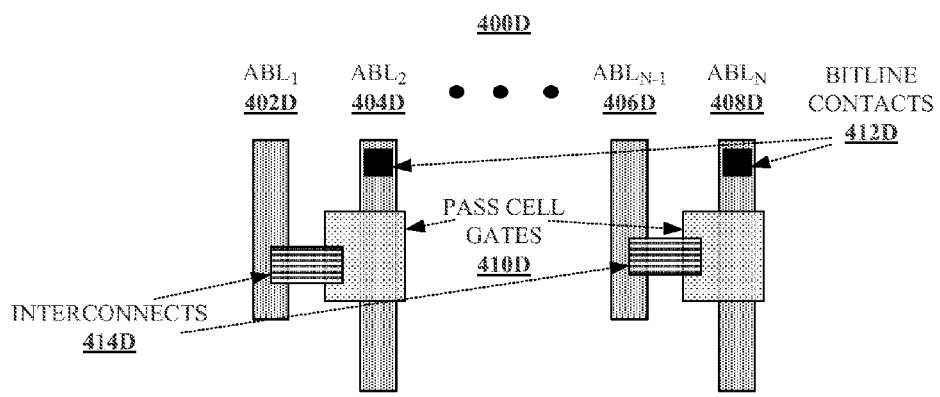

Amplifier region 400A comprises a set of active bitlines $ABL_1$ 402A, $ABL_2$ 404A, $ABL_{N-1}$ 406A, $ABL_N$ 408A, (collectively referred to as active bitlines 402A-408A) formed into a first layer (e.g., substrate layer) of a multi-layer semiconductor memory device. Further, amplifier region 400A comprises a string select gate 410A and a LI select gate 412A that are formed in one or more other layers of the multi-layer semiconductor memory device, and at least one electrical ground 414A. In at least one aspect, an end of one or more of the active bitlines, e.g., active bitline 1 402A and active bitline N-1 406A, can be terminated short of LI select gate 412A and ground 414A, to isolate the end of the active bitline(s) from ground, as depicted at FIG. 4A. In addition to the foregoing, amplifier region 400A comprises a set of discrete pass cell gates 416A. Unlike other transistor gate regions (e.g., string select gate 410A and LI select gate 412A), discrete pass cell gates 416A comprise a series of gate regions that are physically and electrically isolated from each other, as well as from other gate regions (410A, 412A) formed into amplifier region 400A. Accordingly, the discrete pass transistor gates 416A can also be referred to as isolated, or discrete and isolated gates or transistors.

In one aspect of the subject disclosure, the set of discrete pass cell gates 416A can be positioned between string select gate 410A and LI select gate 412A. Further, in this aspect, respective discrete pass cell gates 416A can transverse a subset of active bitlines 402A-408A. For instance, a first pass cell gate (416A) can transverse active bitlines 402A and 404A, whereas a second pass cell gate (416A) can transverse active bitlines 406A and 408A, as depicted at amplifier region 400A. Furthermore, at least one active bitline (e.g., active bitline 402A or active bitline 406A) of respective subsets of active bitlines (e.g., active bitlines 402A and 404A, or active bitlines 406A and 408A, or other suitable subsets of active bitlines 402A-408A) is electrically connected to a pass cell gate via a local interconnect 420A, and a region of the at least one active bitline beneath this pass cell gate is doped or implanted with conducting material (e.g., see FIG. 5). One or more other active bitlines (e.g., active bitline 404A, active bitline 408A) of the respective subsets of active bitlines are not doped with the conducting material, and thus form a channel region of one or more pass transistors. Furthermore, these one or more other active bitlines can be further connected to a contact 418A with a metal bitline of a semiconductor memory device (not depicted, but see FIG. 1, 2 or 8). Accordingly, a gate voltage of respective pass transistor gates is driven by the respective at least one active bitlines connected thereto by respective local interconnects. Further, this gate voltage can control current flow or voltage at the one or more active bitlines connected with respective metal bitlines via respective bitline contacts 418A. As a result, electrical characteristics (including, e.g., memory transistor program or erase state) of the respective at least one active bitlines can be measured from corresponding respective metal bitlines.

As a particular example of the foregoing, a discrete pass transistor gate 416A formed transverse to active bitlines 402A and 404A can be electrically connected to active bitline 402A by a local interconnect 420A, as depicted at amplifier region 400A. Further, a region of active bitline 402A beneath this pass transistor gate 416A can be implanted with conducting material, so electrical charge can flow from active BL 402A to the pass transistor gate 416A. In at least one aspect, active bitline 402A can be shortened so as not to extend under LI select 412A, thereby not forming a transistor at LI select 412A and active bitline 402A. Accordingly, pass transistor gate 416A that is transverse to active bitlines 402A and 404A is not directly connected with LI select gate 412A via active bitline 402A. Instead, a region of active bitline 404A, which does extend to LI select gate 412A, is not doped with conducting material and remains a semiconductor. Accordingly, a source or drain of a pass transistor (416A) can be connected with LI select gate 412A via active bitline 404A. For instance, the source or drain can connect a metal bitline to ground via the bitline contact 418A connected to active bitline 404A. Accordingly, when the pass transistor is conducting, current will flow through the metal bitline; otherwise, when the pass transistor is non-conducting, current will not flow through the metal bitline. Since the conducting/non-conducting state of the pass transistor is based on a gate voltage of such transistor, which in turn is driven by active bitline 402A, memory transistors formed at active bitline 402A can be measured at the metal bitline, based on the current flow (or voltage), or lack thereof. Further, because the pass transistor can be formed to have low capacitance or resistance, this measurement can be conducted at much greater speeds than with conventional serial array memory transistors, which are read by discharging the array to ground or to a high capacitance bitline.

According to particular aspects of the subject disclosure, pass transistor gates 416A are formed in discrete segments within amplifier region 400A. In the case of amplifier region 400A, local interconnects 420A are formed between the pass transistor gates 416A and string select gate 410A. Furthermore, these pass transistor gates 416A are formed over a plurality of active bitlines, and at similar positions within the amplifier region 400A (e.g., substantially on a single line that transverses the active bitlines). However, other arrangements of pass transistor gates and local interconnects are contemplated as part of the subject disclosure, some of which are depicted at amplifier regions 400B, 400C, and 400D, below.

Amplifier region 400B depicts an alternative arrangement of pass transistor gates and local interconnects for an amplifier region of a multi-layer semiconductor memory device. Particularly, amplifier region 400B comprises a set of active bitlines 402B, 404B, 406B, 408B (collectively referred to as 402B-408B), and a set of discrete and isolated pass transistor gates 410B formed transverse to respective subsets of these active bitlines 402B-408B, as described herein. Further, one active bitline (402B and 406B respectively) of each of the respective subsets of active bitlines (402B, 404B and 406B, 408B) is electrically connected to one pass transistor gate 410B by a local interconnect 414B, and a second active bitline (404B and 408B) of the respective subsets of active bitlines (402B, 404B and 406B, 408B) is electrically connected to a metal bitline via a bitline contact 412B. As described herein, this arrangement enables electrical characteristics (e.g., program or erase states of memory transistors) of the respective one active bitlines (402B, 406B) to be measured from the respective second active bitlines (404B, 408B) or from metal bitlines connected to respective bitline contacts 412B.

In contrast to amplifier region 400A, amplifier region 400B comprises local interconnects 414B connected from active bitlines 402B and 406B to respective discrete pass transistor gates 410B on the same side of the discrete pass transistor gates 410B as a string select gate (not depicted). Bitline contacts 412B are connected to adjacent active bitlines 404B and 408B on the side of the discrete pass transistor gates near to the string select gate. In this arrangement, fabrication of local interconnects 414B and bitline contacts 412B can be simpler, less expensive or require fewer processing steps. Accordingly, positioning of local interconnects 414B and bitline contacts 412B in a manner as depicted by amplifier region 400B can provide fabrication benefits for a multi-layer semiconductor memory device.

Amplifier region 400C comprises a set of active bitlines 402C, 404C, 406C, 408C (collectively referred to as active bitlines 402C-408C) and a set of discrete pass transistor gates 410C transverse to respective subsets (402C, 404C and 406C, 408C) of the active bitlines 402C-408C. In addition, a set of local interconnects 414C electrically connect respective first active bitlines (402C, 406C) of the respective subsets of active bitlines (402C, 404C and 406C, 408C) to respective pass transistor gates 410C. Further, a set of bitline contacts 412C electrically connect respective second active bitlines (404C, 408C) of the respective subsets of active bitlines (402C, 404C and 406C, 408C) to metal bitlines of a semiconductor memory device that comprises amplifier region 400C. As depicted, the pass transistor gates 410C can be formed within amplifier region 400C in an offset fashion. Particularly, respective pass transistor gates 410C can be formed along more than a single line that transverses active bitlines 402C-408C. In this manner, fabrication difficulties arising from local interconnects (414C) and bitline contacts (412C) being in close proximity at adjacent active bitlines (e.g., 402C and 404C, or 406C and 408C) can be mitigated or avoided. Furthermore, local interconnects can optionally be positioned differently at different pass transistor gates 410C. For instance, a pass transistor gate 410C that transverses active bitlines 402C and 404C is relatively close to a bitline contact 412C connected to active bitline 404C. Accordingly, a local interconnect 414C connected to active bitline 402C can be on an opposite side of this pass transistor gate 410C that transverses active bitlines 402C and 404C as the bitline contact connected to active bitline 404C. On the other hand, a pass transistor gate 410C that transverses active bitlines 406C and 408C is spaced further from a bitline contact 412C connected with active bitline 408C than the pass transistor gate 410C transversing active bitlines 402C and 404C. Accordingly, a local interconnect 414C connected to active bitline 406C can be on the same side of the pass transistor gate 410C transversing active bitlines 406C and 408C as the bitline contact 412C connected to active bitline 408C.

Significance of position of local interconnects 414C with respect to pass transistor gates 410C is based at least in part on fabrication of amplifier region 400C. For instance, doping active bitlines 402C-408C with conductive material can be impacted by position of local interconnects 414C. Particularly, if pass transistor gates 410C are formed prior to the doping, a region of the respective active bitlines 402C-408C beneath the pass transistor gates 410C will typically be blocked or masked from the doping. Accordingly, these regions will not be conductive. However, this can be problematic where a local interconnect is on an opposite side of a pass transistor gate as an electrical power contact powering a particular active bitline (not depicted, but see bitline contact 108 of FIG. 1, or 208A and 208B of FIG. 2, supra). To illustrate, consider local interconnect 414C connected to active bitline 402C. Although not depicted, a bitline contact can be connected to active bitline 402C in another amplifier region that is above the pass transistor gate 410C that transverses active bitlines 402C and 404C (e.g., an upper amplifier region; see FIG. 3, supra). Accordingly, current flows down active bitline 402C to this pass transistor gate 410C. If a region beneath this pass transistor gate 410C is not doped with conducting material, current will not flow directly from active bitline 402C to the local interconnect connected to active bitline 402C, and to this pass transistor gate 410C. On the other hand, if pass transistor gate 410C is not formed before this doping process, a region of active bitline 404C that transverses active bitlines 402C and 404C beneath this pass transistor gate 410C will not form a channel region of a transistor. To address this problem, the subject disclosure provides for a masking procedure in a multi-layer semiconductor memory device amplifier region (e.g., see FIG. 5, infra). This masking procedure can enable selective conductive doping of a subset of active bitlines of the memory device amplifier region. In one aspect, a photoresist mask can be employed for this masking procedure.

Amplifier region 400D depicts yet another alternative amplifier region of a semiconductor memory device according to aspects of the subject disclosure. Amplifier region 400D comprises a set of active bitlines 402D, 404D, 406D, 408D (collectively referred to as active bitlines 402D-408D) and a set of discrete pass transistor gates 410D. In addition, and in contrast to amplifier regions 400A, 400B and 400C, pass transistor gates 410D are formed over only a single respective active bitline (404D, 408D) of amplifier region 400D. More specifically, respective pass transistor gates are formed over an active bitline of amplifier region 400D that is connected to a bitline contact 412D. Respective local interconnects 414D are formed over adjacent active bitlines (402D, 406D) that are not connected to bitline contacts 412D. These local interconnects 414D form an electrical contact between respective adjacent active bitlines (402D, 406D) and respective pass transistor gates 410D. Thus, a gate voltage of the respective pass transistor gates 410D is driven by electrical power at the adjacent active bitlines (402D, 406D), which controls current flow in a region of active bitlines 404D, 408D beneath the pass transistor gates 410D, as well as within a metal bitline (not depicted) respectively connected to these active bitlines 404D, 408D by bitline contacts 412D. It should be appreciated that, although depicted as being formed along a common line transversing active bitlines 402D-408D, pass transistor gates 410D can be offset in amplifier region 400D (e.g., similar to pass transistor gates 410C of amplifier region 400C). Further, local interconnects 414D are depicted as straight shunts between active bitlines 402D, 406D and respective pass transistor gates 410D. However, it should be appreciated that other geometric forms can be utilized for local interconnects 414D (e.g., right angle connectors extending upward from a substrate layer of amplifier region 400D, and then forming a right angle to connect to the respective pass transistor gates in another semiconductor layer of amplifier region 400D), as well as for pass transistor gates 410D (non-rectangular shapes).

Figure 5:
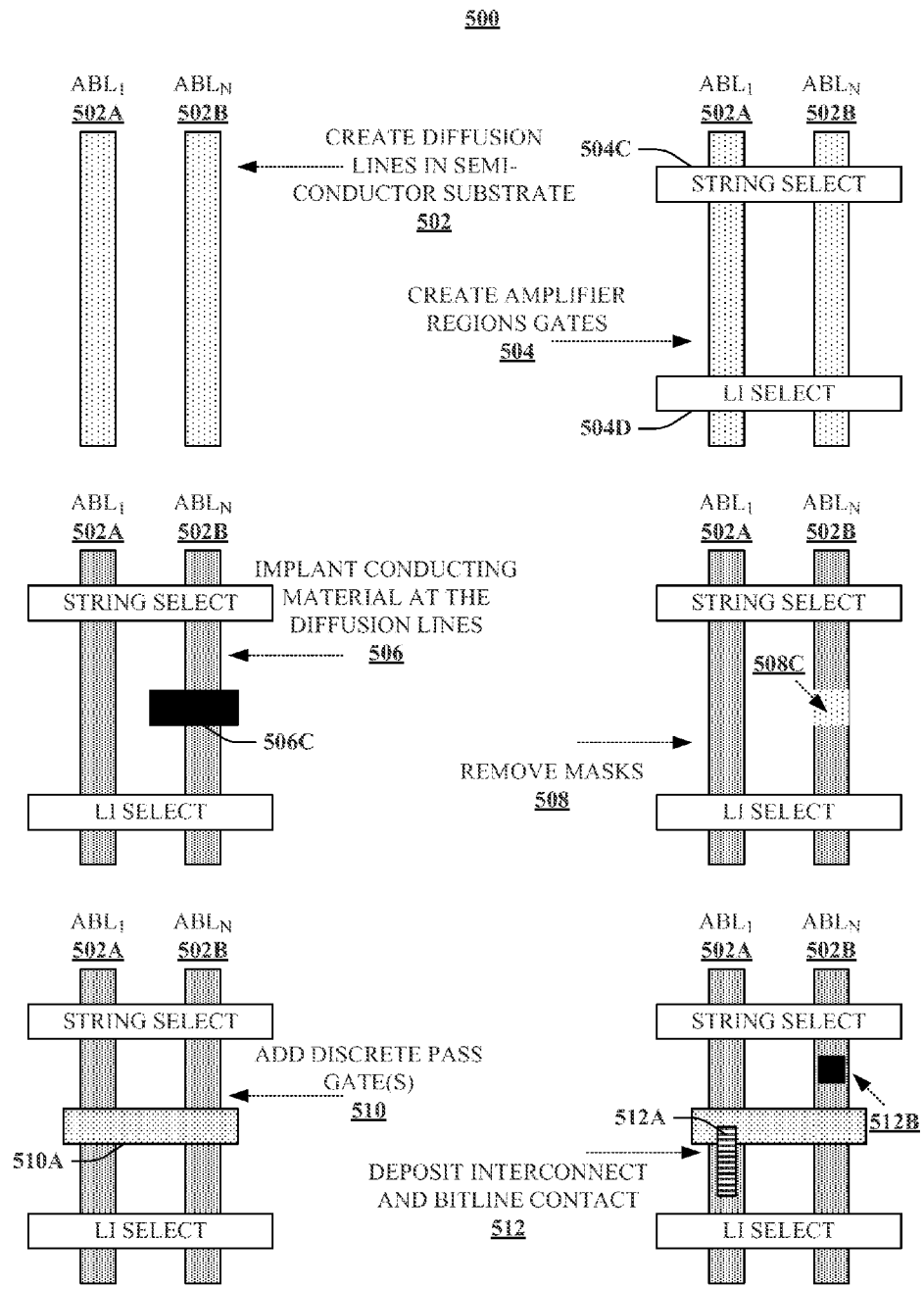
FIG. 5 depicts an example process for forming an amplifier region of serial array semiconductor memory according to still other aspects.

FIG. 5 depicts block diagrams of an example fabrication process 500 to form an amplifier region for high read speed serial array semiconductor memory according to further aspects of the subject disclosure. The high read speed serial array memory according to process 500 can be utilized at least in part to produce various high read speed serial array memory transistor arrangements described herein. It should be appreciated, however, that process 500 is an illustrative example, and is not intended to exhaust the scope of suitable processes for forming an amplifier region of semiconductor memory. Rather, other processes known in the art or made known to one of skill in the art by way of the context provided herein are incorporated as part of the subject disclosure.

Process 500 begins in the upper left of FIG. 5 where, at 502, a set of active bitlines $DL_1$ 502A through $DL_N$ 502B (where N is an even integer) can be formed in a substrate layer of a multi-layer semiconductor device. As an example, active bitlines 502A, 502B can be formed via a semiconductor trenching process, which creates grooves in a surface of the substrate layer between each of the active bitlines 502A, 502B. Furthermore, the grooves can be at least partially filled with insulating material (e.g., an oxide material, such as silicon dioxide) to electrically isolate the respective active bitlines 502A, 502B. In the upper right of FIG. 5, amplifier region transistor gates can be formed at 504. The amplifier region transistor gates can comprise a string select transistor gate 504C and a LI select transistor gate 504D. These transistor gates are formed transverse to the pairs of active bitlines 502A, 502B.

In the middle of FIG. 5 on the left, a mask 506C is created over a subset of the active bitlines 502A, 502B (e.g., over active bitline 502B) and conducting material is implanted into exposed regions of the active bitlines. Exposed regions, as utilized herein, are regions of the semiconductor substrate that are not covered by a mask or another layer (e.g., amplifier region transistor gates 504C, 504D) of the amplifier region. Mask 506C can comprise various material(s) suitable to block a semiconductor doping process. In at least one aspect of the subject disclosure, mask 506C is a photoresist mask. In the middle right of FIG. 5, masks 506C are removed, leaving a subset of the active bitlines with an undoped or lightly-doped semiconductor region 508C. For example, as depicted, a region of active bitline 502A between string select gate 504C and LI select gate 504D can be continuously conducting, whereas a region of active bitline 502B between the transistor gates 504C, 504D can be interrupted by the semi-conducting region 508C. This semi-conducting region 508C can serve to form a transistor along active bitline 502B.

In the lower left of FIG. 5, at 510 discrete and isolated pass transistor gates 510A are formed over subsets of active bitlines 502A, 502B. Particularly, the pass transistor gates 510A are formed at least in part over the semi-conducting region of active bitline 502B, to form a gate region of the semiconductor transistor along active bitline 502B, introduced above. In the lower right of FIG. 5, at 512 a local interconnect 512A is formed between pass transistor gate 510A and active bitline 502A. Furthermore, a bitline contact 512B is formed between active bitline 502B and a metal bitline (not depicted) of the serial array semiconductor memory.

As an alternative to the depictions of 506-512, a discrete portion of a wordline can be formed over active bitline 502B, instead of the depicted mask 506C. This discrete portion (506C) can be formed prior to conductive doping of the remaining portions of active bitlines 502A and 502B, such that this discrete portion (506C) serves to prevent or mitigate implantation of dopants in a region beneath active bitline 502B. After conductive doping is finished, discrete pass gate 510A can be deposited and interconnect 512A and metal bitline contact 512B can be deposited, as described herein. In yet another alternative, an etching or digging process can be formed to remove dopant material at region 506C. In effect, the etching/digging process can remove bitline implant in region 506C to form a channel region of a pass transistor, having a gate formed at 510. As a further alternative, reverse doping can be employed at region 506C after conducting material is implanted into the active bitlines 502A-502B at 506. This reverse doping can be utilized to compensate for dopants implanted in the channel region of the pass transistor instead of the etching/digging process or masking processes described above.

In this manner, electrical power introduced to active bitline 502A from a metal bitline contact (not depicted) above string select gate 504C can drive a gate voltage of pass transistor gate 510A, by way of the conductive doping material formed into exposed regions of active bitline 502A, including a region of active bitline 502A beneath pass transistor gate 510A. Furthermore, the gate voltage of pass transistor gate 510A can modulate current flow or voltage of active bitline 502B within the depicted amplifier region, as well as current flow or voltage of the metal bitline of the serial array semiconductor memory, as described herein. Furthermore, complexities in fabricating local interconnect 512A and bitline contact 512B can be mitigated by positioning these connections (512A, 512B) on opposite sides of pass transistor gate 510A, as depicted. This arrangement can reduce cost and time associated with semiconductor fabrication, providing a tangible benefit thereto.

Figure 7:
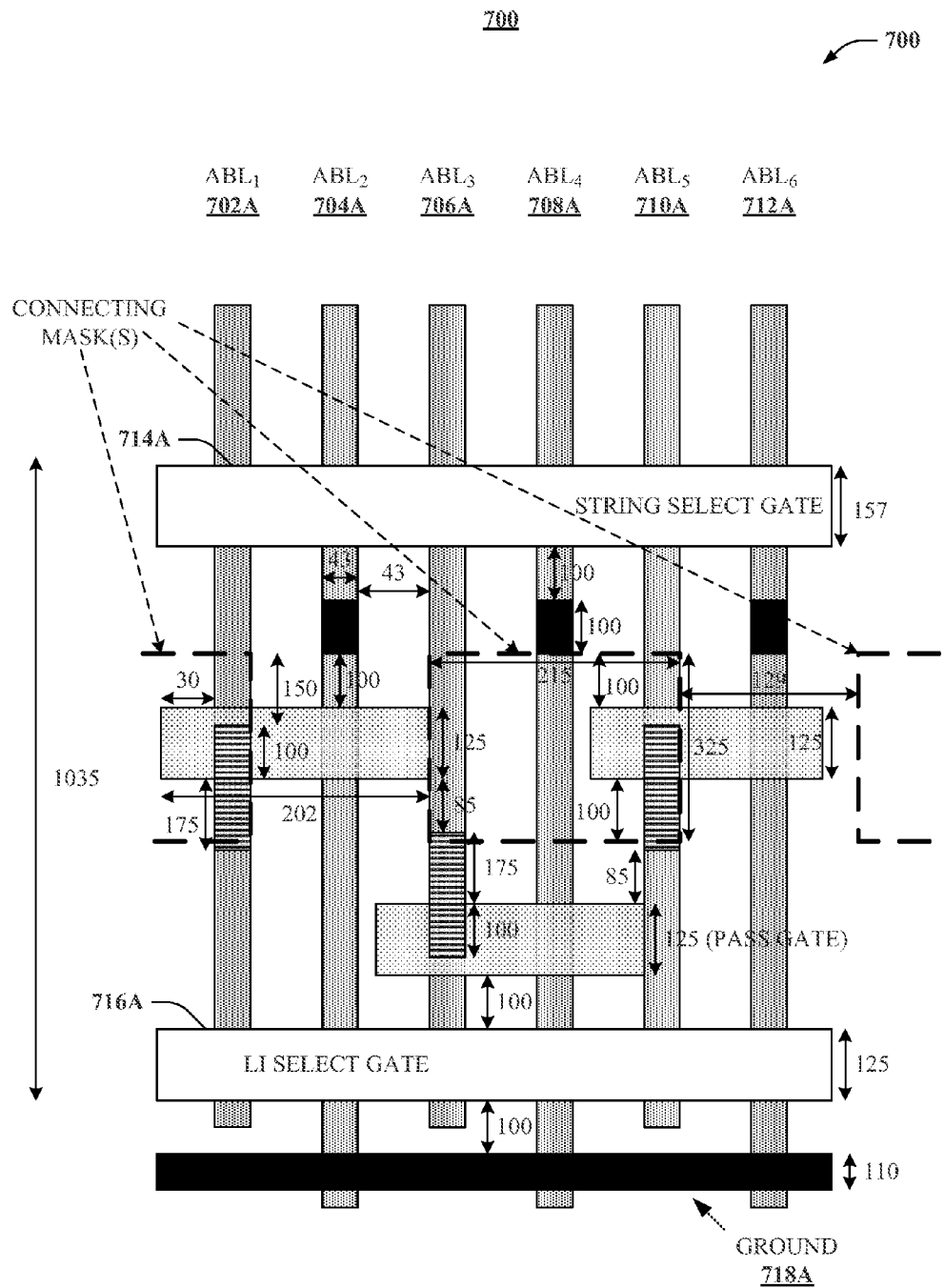
FIG. 7 depicts a block diagram of a sample amplifier region for a serial array semiconductor according to an additional aspect.

FIGS. 6 and 7 illustrate block diagrams of respective alternative example amplifier regions 600, 700 of a multi-layer semiconductor memory device according to particular aspects of the subject disclosure. Amplifier regions 600 and 700 comprise a series of active bitlines 602A-612A, 702A-712A formed in a substrate layer of the multi-layer semiconductor memory device. Additionally, wordlines are formed transverse to the active bitlines 602A-612A, 702A-712A to form respective string select gates 614A, 714A and respective LI select gates 616A, 716A. Additionally, respective ground regions 618A, 718A are deposited adjacent to LI select gates 616A and 716A, respectively.

Between the string select gates and LI select gates of amplifier regions 600 and 700 are formed discrete pass transistor gates. Various numbers within the respective amplifier regions 600, 700 depict example dimensions, positions and locations of respective components of amplifier regions 600, 700. It should be appreciated that the subject disclosure is not limited to these specific dimensions, however. Rather, other suitable dimensions employed for the various components, positions and locations are within the scope of the subject disclosure.

Figure 8:
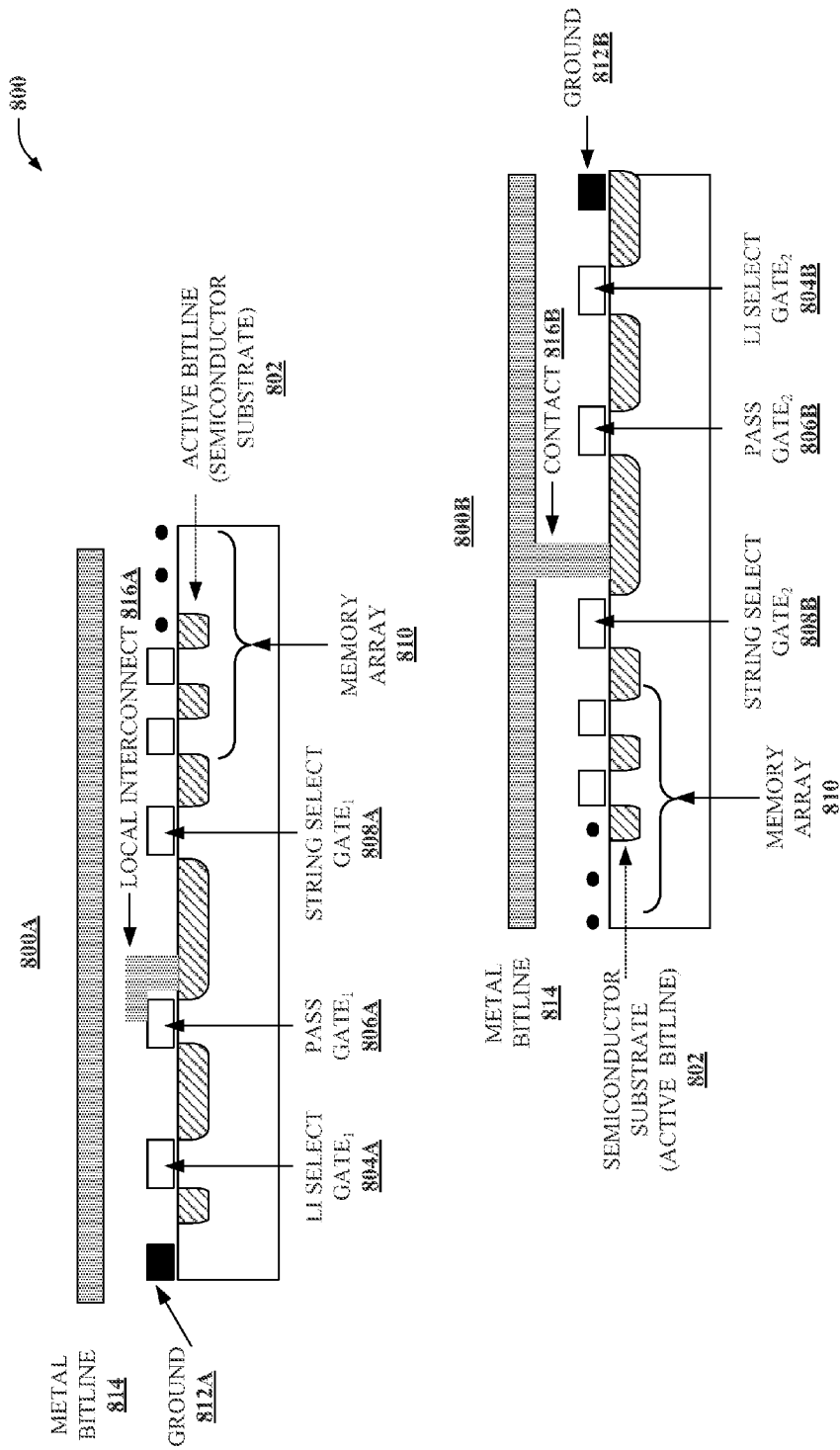
FIG. 8 depicts a block diagram of an example cross-section view of a serial array semiconductor memory architecture according additional aspects.

FIG. 8 illustrates a block diagram of a side view layout 800 of a multi-layer semiconductor memory device according to still other aspects of the subject disclosure. Layout 800 comprises two segments (800A, 800B) of the multi-layer semiconductor memory device, including a first segment 800A comprising a lower amplifier region and lower part of serial arrays of memory transistors, and a second segment 800B comprising an upper amplifier region and upper part of the serial arrays of memory transistors. First segment 800A and second segment 800B are side-views of a common active bitline of the semiconductor memory device, on different ends thereof. As one example, first segment 800A could pertain to a side-view of active bitline 302A at lower amplifier region 304B of FIG. 3, supra, whereas second segment 800B could pertain to a side-view of active bitline 302A at upper amplifier region 304A of FIG. 3. It should be appreciated, however, that semiconductor features not depicted at FIG. 3 are not to be construed as limiting the semiconductor memory device of layout 800. Rather, the comparison is for illustrative purposes, to facilitate proper orientation of the two side view segments 800A, 800B depicted by layout 800.

Lower amplifier region 800A comprises a semiconductor substrate of an active bitline 802 (that transverses amplifier region segments 800A and 800B) of the semiconductor memory device. Active bitline 802 comprises a series of transistor gate regions formed into a layer of the multi-layer semiconductor memory device, above the semiconductor substrate 802. It should be appreciated that the transistor gate regions are formed transverse to the active bitlines of the multi-layer semiconductor memory device (e.g., into or out of the drawing page of FIG. 8). It should also be appreciated that, although not depicted, various insulating material (e.g., an oxide material, such as silicon dioxide) can be formed between the semiconductor substrate layer and the layer comprising the transistor gate regions.

At a far end of active bitline 802 is formed a first LI select gate, LI select gate$_1$ 804A. A conducting region (shaded area) of semiconductor substrate 802 that comprises a source of LI select gate$_1$ 804A is formed so as to electrically isolate LI select gate$_1$ 804A from electrical ground 812A. Further along active bitline 802 is formed a pass transistor gate$_1$ 806A. The source of pass transistor gate$_1$ 806A is electrically connected to the drain of LI select gate$_1$ 804A by conducting region of active bitline 802 between the respective gate regions 804A, 806A. In addition, pass transistor gate$_1$ 806A is directly connected with another conducting region of active bitline 802 on an opposite side of pass transistor gate 806A via a local interconnect 816A. In at least one aspect of the subject disclosure, local interconnect 816A can be comprised at least in part of a conducting material such as tungsten, a tungsten alloy or tungsten derivative, or a suitable combination thereof.

Local interconnect 816A electrically connects pass transistor gate$_1$ 806A to one end of a serial array of memory transistors, memory array 810 (that transverses amplifier region segments 800A and 800B), via a string select transistor formed at string select gate$_1$ 808A. Memory array 810 comprises a series of memory transistor gates formed into the gate layer of the multi-layer semiconductor device of layout 800. These memory transistor gates and a region of active bitline 802 beneath these memory transistor gates form respective memory transistors connected electrically in serial along respective source and drain regions thereof, along active bitline 802. Memory array 810 can be powered by a metal bitline contact 816B in upper region 800B of active bitline 802.

Side view segment 800B depicts an upper memory array and amplifier region of active bitline 802. At a far end of active bitline 802 in upper amplifier region 800B is formed a LI select gate$_2$ 804B. The source of LI select gate$_2$ 804B is connected to electrical ground 812B. At an opposite side of LI select gate$_2$ 804B is formed a pass transistor gate$_2$ 806B. Unlike lower amplifier region depicted at 800A, above, pass transistor gate$_2$ 806B is not directly connected with active bitline 802. In some aspects of the subject disclosure, pass transistor gate$_2$ 806B extends over an adjacent active bitline (not depicted) of the multi-layer semiconductor memory device, and is electrically connected to an array of memory transistors formed into the adjacent active bitline. Further, this electrical coupling can drive a gate voltage of pass gate$_2$ 806B, which causes a region of active bitline 802 beneath pass gate$_2$ 806B to conduct, or not to conduct, electricity. This conducting/non-conducting state of pass gate$_2$ 806B can connect a metal bitline contact 816B to ground, or insulate metal bitline contact 816B from ground, respectively. This enables sensing of the array of memory transistors formed into the adjacent active bitline from metal bitline 814.

Beyond metal bitline contact 816B is formed string select gate$_2$ 808B, which is connected to an upper amplifier region end of memory array 810. Further, metal bitline contact 816B provides electrical power to memory array 810, if string select gate$_2$ 808B is selected, or activated. Accordingly, electrical charge (or lack thereof) from metal bitline contact 816B can be utilized to program or erase respective transistors of memory array 810. Furthermore, this electrical power can drive a voltage of pass gate$_1$ 806A, enabling program or erase states of memory transistors of memory array 810 to be measured from an adjacent bitline of the multi-layer semiconductor memory device associated with pass gate$_1$ 806A, as described herein.

The aforementioned diagrams have been described with respect to interaction between several components, or memory architectures. It should be appreciated that such diagrams and architectures can include those architectures specified therein, some of the specified architectures, and/or additional architectures. For example, a semiconductor architecture could include a combination of amplifier region 400B, and amplifier region 400C, or a different combination of these or other architectures. Sub-components could also be implemented as architectures electrically connected to other sub-components rather than included within a parent architecture. Additionally, it should be noted that one or more disclosed processes could be combined into a single process providing aggregate functionality. For instance, a program process can comprise an erase process, or vice versa, to facilitate programming and erasing a semiconductor cell by way of a single process. Components of the disclosed architectures can also interact with one or more other components not specifically described herein but known by those of skill in the art.

Figure 9:
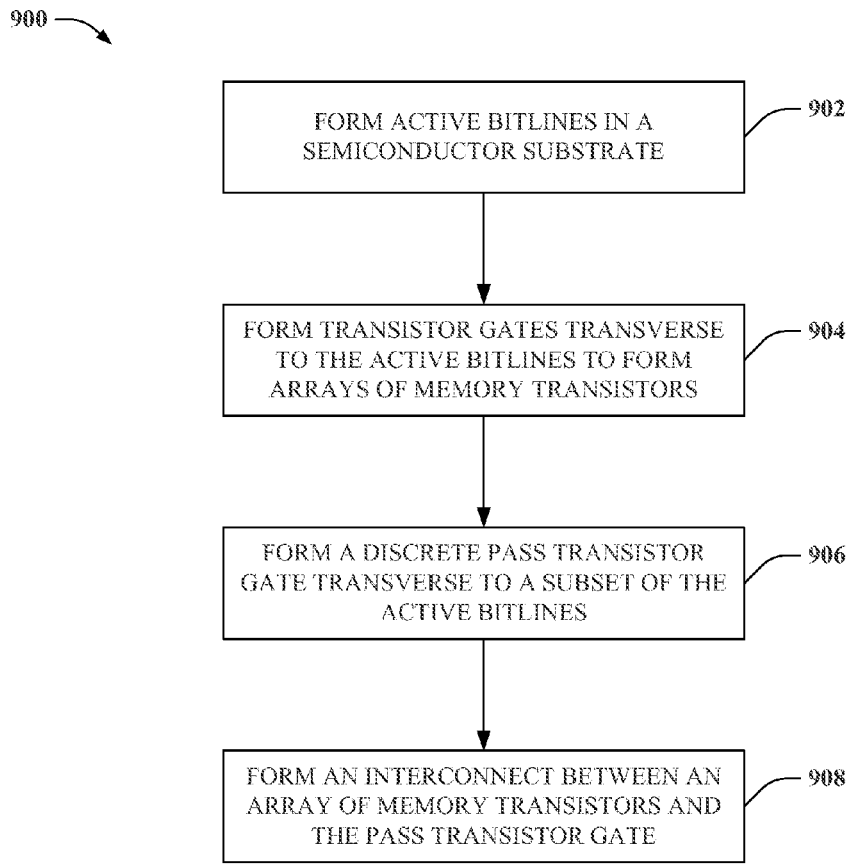
FIG. 9 illustrates a flowchart of an example methodology for forming a serial array semiconductor memory device according to one or more aspects.
Figure 10:
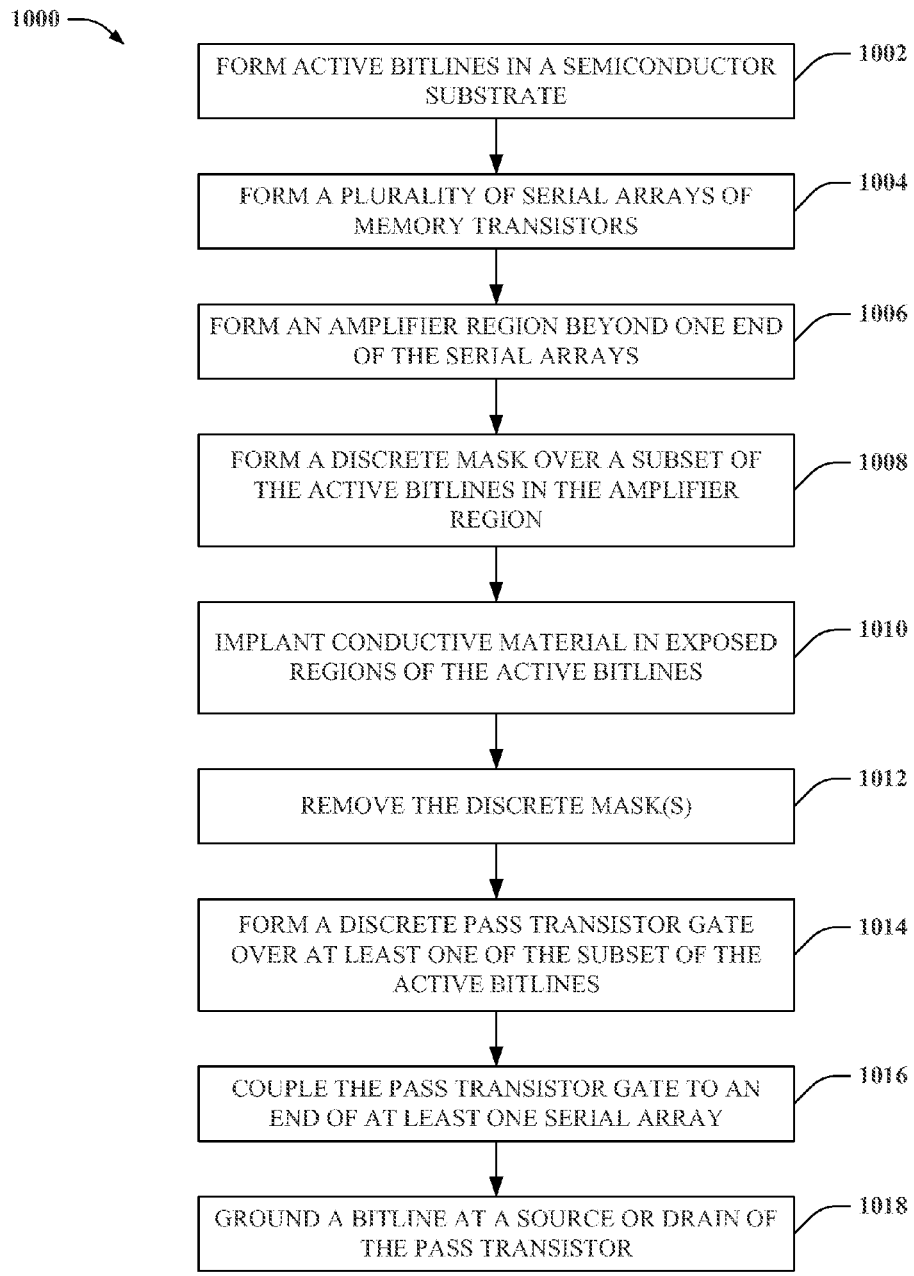
FIG. 10 illustrates a flowchart of a sample methodology for forming discrete and isolated pass transistors in an amplifier region of semiconductor memory.
Figure 11:
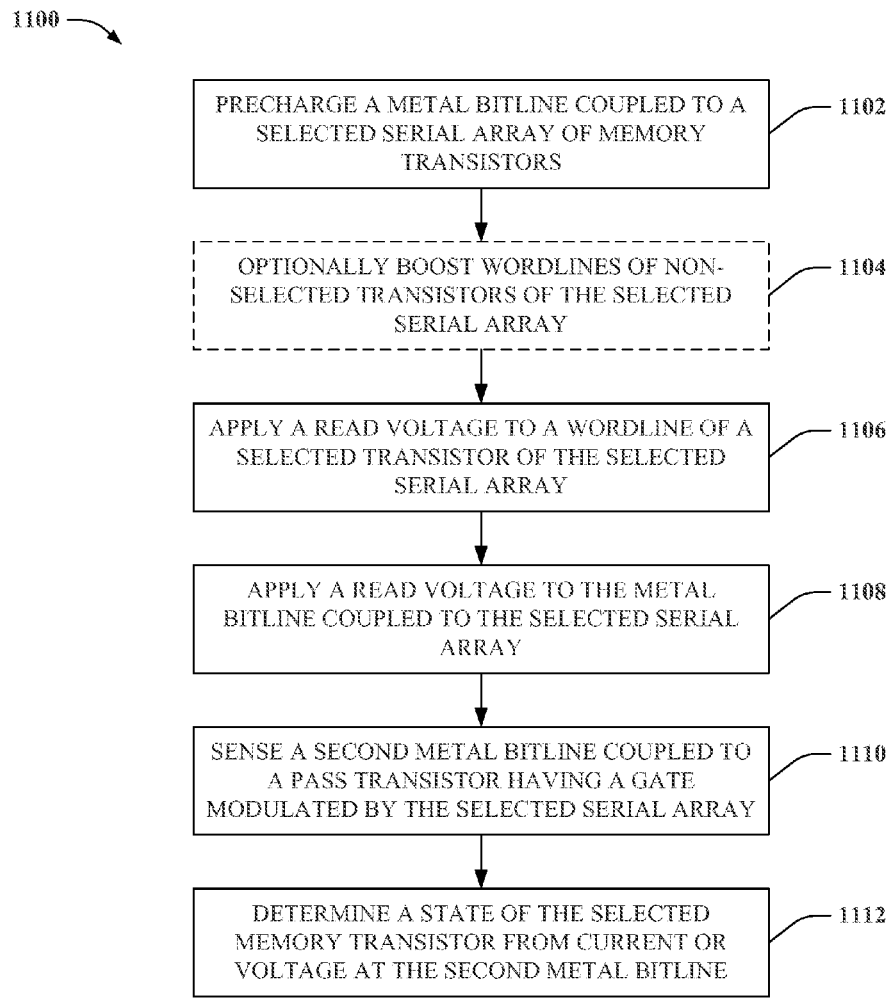
FIG. 11 depicts a flowchart of an example methodology for reading serial array semiconductor memory according to further disclosed aspects.

In view of the exemplary diagrams described supra, process methodologies that may be implemented in accordance with the disclosed subject matter will be better appreciated with reference to the flow charts of FIGS. 9-11. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methodologies described hereinafter. Additionally, it should be further appreciated that the methodologies disclosed hereinafter and throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 9 illustrates a flowchart of an example methodology 900 for fabricating high read speed serial array semiconductor memory according to aspects of the subject disclosure. At 902, method 900 can comprise forming active bitlines in a semiconductor substrate layer of an electronic memory. The active bitlines can be formed via a suitable trenching process, which can further involve filling in trenches between the active bitlines with electrically insulating material.

Further to the above, at 904, method 900 can comprise forming transistor gates transverse to the active bitlines in a second semiconductor layer to form arrays of memory transistors. These arrays can comprise multiple memory transistors arranged electrically in serial along respective active bitlines, for instance. At 906, method 900 can comprise forming an amplifier region comprising a discrete pass transistor gate that is transverse to a subset of the active bitlines. The discrete pass transistor gate can be electrically isolated from other gate regions of the semiconductor memory, as well as other pass transistor gates formed into the semiconductor memory. At 908, method 900 can comprise forming a conductive interconnect between the semiconductor substrate layer and the second semiconductor layer that electrically connects the discrete pass transistor gate to an end of one memory transistor array, such that the array of memory transistors can drive a voltage of the pass transistor gate. Further, a source or drain region associated with the pass transistor gate can be utilized to connect a metal bitline of the electronic memory, adjacent to the memory transistor array, to ground. The pass transistor gate voltage furthermore modulates current flow at the metal bitline, enabling sensing of memory transistors of the array of memory transistors from this metal bitline, or a contact associated there with.

In at least one additional aspect of the subject disclosure, method 900 can further comprise isolating an end of the memory transistor array from ground. For instance, isolating the end of the memory transistor can comprise blocking a bitline implant (e.g., a conductive dopant in the case of a silicon substrate layer) in a region of one of the active bitlines between the end of the memory transistor array and the ground. In another example, isolating the memory transistor from ground can comprise etching or digging to remove the bitline implant (e.g., previously deposited into the region of the active bitline) from the region of the one of the active bitlines. In yet another example, isolating the end of the memory transistor array can comprise forming an insulating mask between the region of the one of the active bitlines and the ground. A combination of the foregoing or of like techniques can also be employed.

FIG. 10 depicts a flowchart of a sample methodology 1000 for fabricating high read speed serial array semiconductor memory according to still other aspects of the subject disclosure. At 1002, method 1000 can comprise forming active bitlines in a substrate layer of a multi-layer semiconductor. At 1004, method 1000 can comprise forming a plurality of serial arrays of memory transistors along the respective active bitlines. At 1006, method 1000 can comprise forming an amplifier region beyond one end of the serial arrays of memory transistors. At 1008, method 1000 can comprise forming a discrete photoresist mask over a subset of the active bitlines in the amplifier region. In one aspect, the subset of the active bitlines corresponds with a single active bitline; in other aspects the subset of the active bitlines can correspond with multiple active bitlines.

At 1010, method 1000 can comprise implanting conductive material into exposed regions of the respective active bitlines. Particularly, the exposed regions can include regions of the active bitlines that are not beneath gate regions of the serial arrays of memory transistors, and regions of the active bitlines that are not beneath the photoresist mask. At 1012, method 1000 can comprise removing the photoresist mask. At 1014, method 1000 can comprise forming a discrete pass transistor gate over at least one of the subset of the active bitlines and over at least one active bitline neighboring the subset of the active bitlines. At 1016, method 1000 can comprise coupling the discrete pass transistor gate to an end of at least one of the serial arrays of memory transistors. According to particular aspects of the subject disclosure, the coupling can comprise forming a local interconnect between the pass transistor gate and the at least one active bitline neighboring the subset of the active bitlines. At 1018, method 1000 can comprise coupling to ground the at least one of the subset of the active bitlines at a transistor source or drain region associated with the discrete pass transistor gate.

FIG. 11 illustrates a flowchart of an example methodology 1100 for operating high read speed serial array semiconductor memory according to yet other aspects of the subject disclosure. At 1102, method 1100 can comprise pre-charging a metal bitline connected to a selected serial array of memory transistors. At 1104, method 1100 can optionally comprise boosting wordlines of non-selected transistors of the selected serial array to induce a voltage boost along the selected serial array of memory transistors. At 1106, method 1100 can comprise applying a read voltage to a wordline of a selected transistor of the selected serial array. In at least one aspect, the read voltage can be between substantially 0.5 volts and 2.0 volts. According to a particular aspect, the read voltage can be substantially 1.2 volts. At 1108, method 1100 can comprise applying a bitline read voltage to the metal bitline connected to the selected serial array. At 1110, method 1100 can comprise sensing a second metal bitline connected to a pass transistor having a gate region that is modulated by the selected serial array. At 1112, method 1100 can comprise determining a state of the selected memory transistor from current or voltage at the second metal bitline.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the appended claims. Furthermore, to the extent that the term "includes" "has" or "having" are used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

Figure 12:
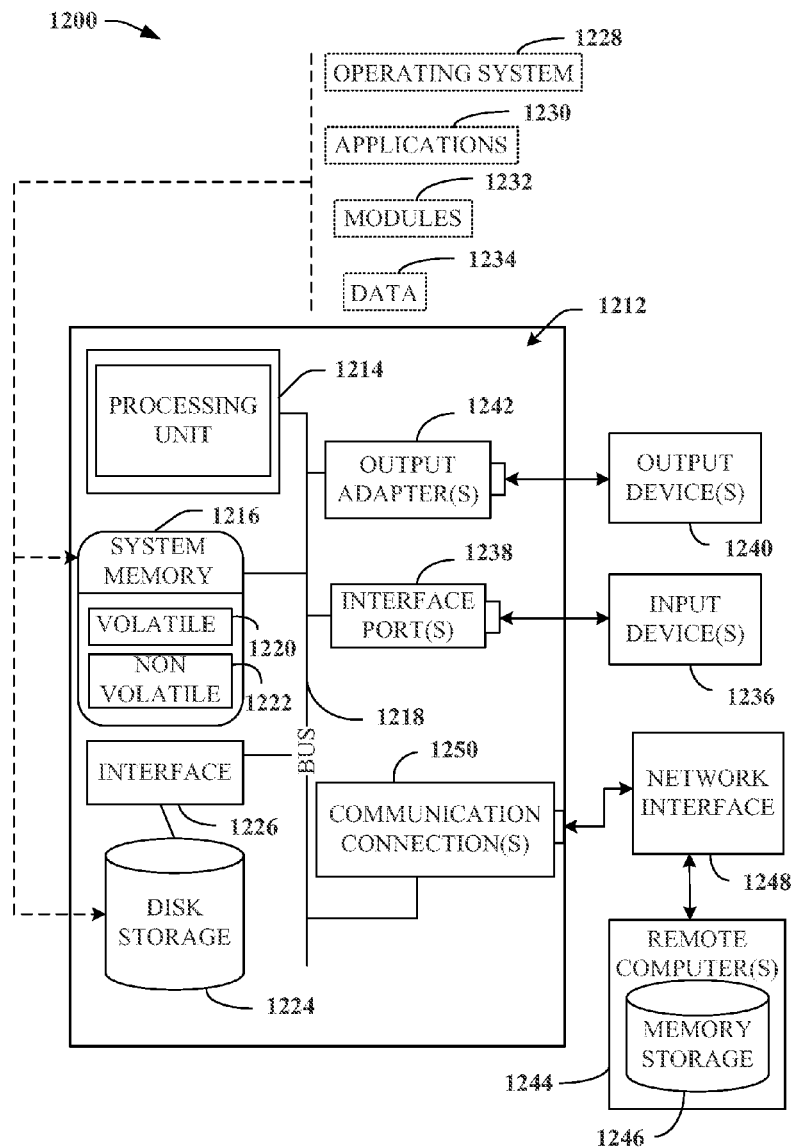
FIG. 12 illustrates a block diagram of an example processing system for utilizing or accessing non-volatile memory according to general aspects disclosed herein.

In order to provide a context for the various aspects of the disclosed subject matter, FIG. 12, as well as the following discussion, is intended to provide a brief, general description of a suitable environment in which various aspects of the disclosed subject matter can be implemented or processed. While the subject matter has been described above in the general context of semiconductor architectures and process methodologies for manipulating semiconductor devices of such architectures, those skilled in the art will recognize that the subject innovation also may be implemented in combination with other architectures or process methodologies. Moreover, those skilled in the art will appreciate that the inventive processes may be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a Flash memory module. In a distributed computing environment, program modules may be located in both local and remote memory storage modules or devices.

With reference to FIG. 12, a suitable environment 1200 for implementing various aspects of the claimed subject matter can include a host computer 1212. The host computer 1212 includes a processing unit 1214, a system memory 1216, and a system bus 1218. The system bus 1218 connects system components including, but not limited to, the system memory 1216 to the processing unit 1214. The processing unit 1214 can be any of various available processors. Dual microprocessors and other multiprocessor architectures also can be employed as the processing unit 1214.

The system bus 1218 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1216 includes volatile memory 1220 and nonvolatile memory 1222. The basic input/output system (BIOS), containing the basic routines to transfer information between elements within the computer 1212, such as during start-up, is stored in nonvolatile memory 1222. By way of illustration, and not limitation, nonvolatile memory 1222 can include ROM, PROM, EPROM, EEPROM, or Flash memory (e.g., AND Flash, NAND Flash, NOR Flash, CT-NOR Flash, CT-NAND Flash, and so on). Furthermore, nonvolatile memory 1222 can provide the platform for the various semiconductor architectures described herein. Volatile memory 1220 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Host computer 1212 also includes removable/non-removable, volatile/non-volatile computer storage media. FIG. 12 illustrates, for example, a disk storage 1224. Disk storage 1224 includes, but is not limited to, devices like a magnetic disk drive, floppy disk drive, tape drive, Jaz drive, Zip drive, LS-100 drive, flash memory card, or memory stick. In addition, disk storage 1224 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). Furthermore, disk storage 1224 can provide the platform for the various semiconductor architectures described herein. To facilitate connection of the disk storage devices 1224 to the system bus 1218, a removable or non-removable interface is typically used, such as interface 1226.

It is to be appreciated that FIG. 12 describes software that acts as an intermediary between users and the basic computer resources described in the suitable operating environment 1200. Such software includes an operating system 1228. Operating system 1228, which can be stored on disk storage 1224, acts to control and allocate resources of the host computer system 1212. System applications 1230 take advantage of the management of resources by operating system 1228 through program modules 1232 and program data 1234 stored either in system memory 1216 or on disk storage 1224. It is to be appreciated that the disclosed subject matter can be implemented with various operating systems or combinations of operating systems.

A user enters commands or information into the host computer 1212 through input device(s) 1236. Input devices 1236 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1214 through the system bus 1218 via interface port(s) 1238. Interface port(s) 1238 include, for example, a serial port, a parallel port, a game port, and a universal serial bus (USB). Output device(s) 1240 use some of the same type of ports as input device(s) 1236. Thus, for example, a USB port may be used to provide input to host computer 1212 and to output information from host computer 1212 to an output device 1240. Output adapter 1242 is provided to illustrate that there are some output devices 1240 like monitors, speakers, and printers, among other output devices 1240, which require special adapters. The output adapters 1242 include, by way of illustration and not limitation, video and sound cards that provide a means of connection between the output device 1240 and the system bus 1218. It should be noted that other devices and/or systems of devices provide both input and output capabilities such as remote computer(s) 1244.

Host computer 1212 can operate in a networked environment using logical connections to one or more remote computers, such as remote computer(s) 1244. The remote computer(s) 1244 can be a personal computer, a server, a router, a network PC, a workstation, a microprocessor based appliance, a peer device or other common network node and the like, and typically includes many or all of the elements described relative to host computer 1212. For purposes of brevity, only a memory storage device 1246 is illustrated with remote computer(s) 1244. Remote computer(s) 1244 is logically connected to host computer 1212 through a network interface 1248 and then physically connected via communication connection 1250. Network interface 1248 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1250 refers to the hardware/software employed to connect the network interface 1248 to the bus 1218. While communication connection 1250 is shown for illustrative clarity inside host computer 1212, it can also be external to host computer 1212. The hardware/software necessary for connection to the network interface 1248 includes, for exemplary purposes only, internal and external technologies such as, modems including regular telephone grade modems, cable modems and DSL modems, ISDN adapters, and Ethernet cards.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes. In addition, while a particular feature may have been disclosed with respect to only one of several implementations, such feature may be combined with one or more other features of the other implementations as may be desired and advantageous for any given or particular application.

What is claimed is:

1. Electronic memory, comprising:
    a serial array of memory transistors connected at one end of the serial array to a gate of a pass transistor;
    an electrical contact that connects a metal bitline of the electronic memory to a source or drain of the pass transistor, wherein:
        the gate of the pass transistor is a discreet segment of a semiconductor architecture that is isolated from a neighboring gate of a neighboring pass transistor; and
    a sensing circuit connected to the metal bitline.

2. The electronic memory of claim 1, the gate of the pass transistor is isolated within the semiconductor architecture with a self-aligned poly process.

3. The electronic memory of claim 1, the gate of the pass transistor is isolated within the semiconductor architecture with a dedicated patterning process.

4. The electronic memory of claim 1, the pass transistor having a channel region that is isolated within the semiconductor architecture by a masking process that prevents or mitigates implantation of dopants into the channel region.

5. The electronic memory of claim 1, the pass transistor having a channel region that is isolated within the semiconductor architecture by an etching process that removes dopants from the channel region.

6. The electronic memory of claim 1, the pass transistor having a channel region that is isolated within the semiconductor architecture by a reverse doping process that compensates dopants in the channel region.

7. The electronic memory of claim 1, wherein a current flowing along the serial array activates or deactivates the pass transistor via the pass transistor gate.

8. The electronic memory of claim 7, wherein the sensing circuit is configured to detect enabling or disabling of the pass transistor.

9. The electronic memory of claim 8, wherein the sensing circuit detects the enabling or the disabling of the pass transistor by sensing a read current or lack of read current, respectively, at the metal bitline.

10. The electronic memory of claim 1, further comprising a second array of transistors arranged electrically in serial, the second array having one end connected to the metal bitline and having another end connected to a gate of a second pass transistor.

11. The electronic memory of claim 10, the second pass transistor modulates current or voltage of another metal bitline of the electronic memory that is connected to a source or drain of the second pass transistor.

12. A method for operating an electronic memory device, comprising:
    selecting a serial array of the electronic memory device for a read operation;
    apply a wordline read voltage to a wordline of a selected transistor of the serial array;
    apply a bitline read voltage to a metal bitline connected to a first end of the serial array;

sensing at least one of a voltage or a current of a second metal bitline, other than the metal bitline, for determining a state of the selected transistor.

13. The method of claim 12, further comprising precharging the metal bitline to facilitate preparing the serial array for the applying the read voltage to the metal bitline.

14. The method of claim 12, further comprising increasing voltage of a second wordline connected to a non-selected transistor of the serial array.

15. The method of claim 12, further comprising increasing voltage of a plurality of wordlines connected respectively to a plurality of non-selected transistors of the serial array.

16. The method of claim 12, further comprising sensing the metal bitline for determining a state of an additional transistor connected to a second serial array of the electronic memory device for a further read operation.

17. A system for operating an electronic memory, comprising:
    means for selecting a serial array of the electronic memory for a read operation;
    means for applying a select read voltage to a wordline of a selected transistor of the serial array;
    means for applying an activation read voltage to a metal bitline connected to a first end of the serial array; and
    means for sensing at least one of a current flow or a voltage at a pass transistor via a second metal bitline in response to applying the activation read voltage to the metal bitline.

18. The system of claim 17, further comprising means for precharging the metal bitline in preparation for the read operation.

19. The system of claim 17, further comprising means for boosting voltage of one or more additional wordlines connected respectively to additional transistors on the serial array.

20. The system of claim 17, further comprising means for determining a program or erase state of the selected transistor as a function of at least one of current flow or voltage sensed at the pass transistor via the second metal bitline.

* * * * *